United States Patent
Niu et al.

(10) Patent No.: US 6,624,726 B2
(45) Date of Patent: Sep. 23, 2003

(54) HIGH Q FACTOR MEMS RESONATORS

(75) Inventors: Feng Niu, Weston, FL (US); Kenneth D. Cornett, Coral Springs, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/944,568

(22) Filed: Aug. 31, 2001

(65) Prior Publication Data

US 2003/0052742 A1 Mar. 20, 2003

(51) Int. Cl.⁷ ............................................... H03H 9/205
(52) U.S. Cl. .................. 333/197; 333/186; 333/187; 333/198; 333/200; 310/96
(58) Field of Search ................................ 333/186, 197, 333/198, 200, 187; 310/9.6

(56) References Cited

U.S. PATENT DOCUMENTS

| | | | | |
|---|---|---|---|---|
| 4,013,983 A | * | 3/1977 | Hartemann | 310/313 A |
| 4,464,639 A | * | 8/1984 | Staples | 29/25.35 |
| 4,468,642 A | * | 8/1984 | Hikita | 310/313 D |
| 4,583,063 A | * | 4/1986 | Milsom | 333/187 |
| 5,640,133 A | * | 6/1997 | MacDonald et al. | 333/197 |
| 5,751,200 A | | 5/1998 | Yamashita et al. | |
| 5,889,449 A | * | 3/1999 | Fiedziuszko | 333/239 |
| 5,955,932 A | * | 9/1999 | Nguyen et al. | 333/186 |
| 6,249,073 B1 | * | 6/2001 | Nguyen et al. | 310/309 |
| 6,424,074 B2 | | 7/2002 | Nguyen | |

OTHER PUBLICATIONS

Tsukai et al. Pub. No.:US 2002/0030420 A1 Filed Aug. 28, 2001 with Foreign Application priority data 2000–26283708 on Aug. 31, 2000.*

* cited by examiner

*Primary Examiner*—Michael Tokar
*Assistant Examiner*—Linh Van Nguyen
(74) *Attorney, Agent, or Firm*—Barbara R. Doutre

(57) ABSTRACT

Microelectromechanical resonators that can be fabricated on a semiconductor die by processes normally used in fabricating microelectronics (e.g., CMOS) circuits are provided. The resonators comprises at least two vibratable members that are closely spaced relative to a wavelength associated with their vibrating frequency, and driven to vibrate one-half a vibration period out of phase with each other, i.e. to mirror each others motion. Driving the vibratable members as stated leads to destructive interference effects that suppress leakage of acoustic energy from the vibratable members into the die, and improve the Q-factor of the resonator. Vibratable members in the form of vibratable plates that are formed by deep anisotropic etching one or more trenches in the die are disclosed. Embodiments in which two sets of vibratable plates are spaced by ½ the aforementioned wavelength to further suppress acoustic energy leakage, and improve the Q-factor of the resonator are disclosed.

55 Claims, 10 Drawing Sheets

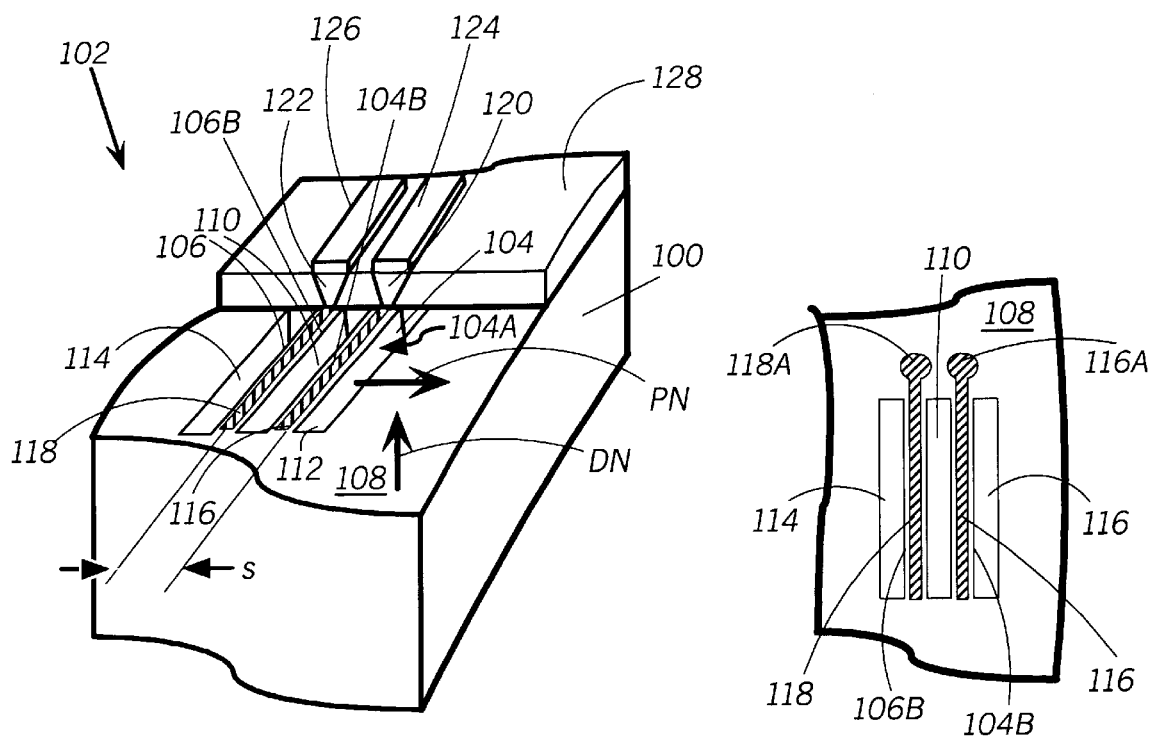
FIG. 1  FIG. 2
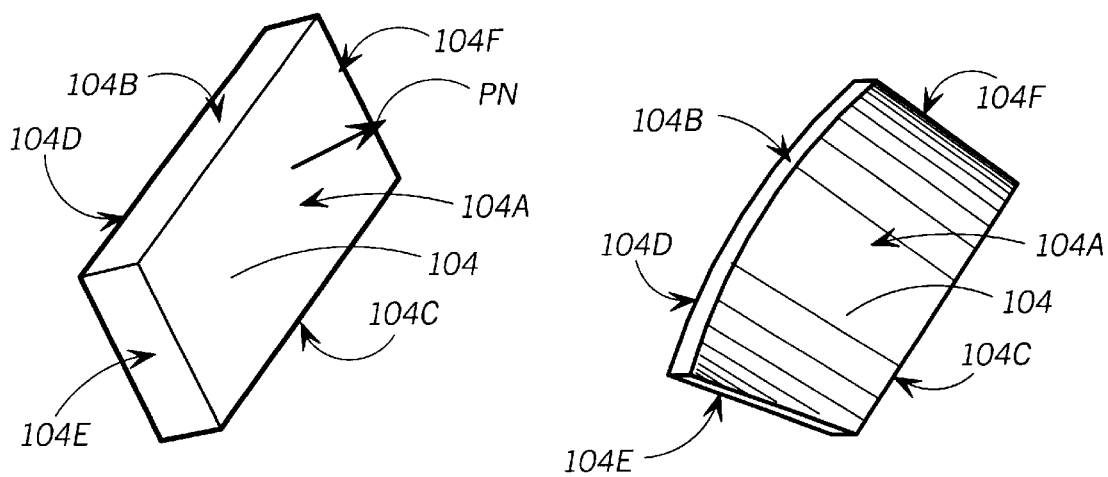
FIG. 3  FIG. 4

HIGH Q FACTOR MEMS RESONATORS

FIELD OF THE INVENTION

The present invention relates to Microelectromechanical Systems (MEMS). More particularly, the present invention pertains to frequency selective MEMS devices.

BACKGROUND OF THE INVENTION

Currently there is an interest in increasing the degree of integration in electronics. One reason to increase the degree of integration is to construct a system-on-a-chip. In a system-on-a-chip all the electronics for a system, including, for example, sensors, signal processing, and communication circuits are fabricated on a single semiconductor die. Aside from systems-on-a-chip, increasing the degree of integration can lower manufacturing costs, and allow for increased functionality, and reduce power requirements.

Frequency selective components, that are used in oscillators, for example, are used in a wide variety of electronic circuits, including communications circuits, and microprocessors. Traditionally quartz resonators have been used as frequency selective elements in oscillator circuits (e.g. Colpitts Oscillator, Pierce Oscillator). Unfortunately quartz resonators are costly, bulky discrete components.

Recently attention has turned to the field of Microelectromechanical Systems (MEMS) for an alternative to quartz resonators.

In order to integrate a MEMS resonator with an electronic circuit, it is necessary that its design be compatible with the materials and process used in fabricating the electronic circuit. One established and widely used, set of materials and processes are those used to fabricate Complementary Metal Oxide Semiconductor (CMOS) integrated circuits. CMOS is particularly suited to making lower power consumption digital integrated circuits. CMOS integrated circuits are commonly fabricated in N or P type monocrystalline semiconductor wafers. In certain CMOS fabrication processes deep anisotropic etching is used to form capacitors. Such capacitors are used to store a charge in CMOS based memory. It would be desirable to have a MEMS fabrication process that is compatible with CMOS processes and materials.

Although MEMS devices are small compared to equivalent discrete devices, they are typically large compared to integrated circuit electrical devices (e.g. transistors). The area occupied by an integrated circuit is significant in determining its cost. This is because the area of an integrated circuit determines the number of semiconductor die's bearing the circuit that can be made simultaneously on a single wafer, and the cost of semiconductor processes are determined on a per wafer basis. It is desirable to have MEMS resonators that occupy a relatively small amount of area on a surface of a semiconductor die on which they are fabricated.

Another issue to be addressed in the design of MEMS resonators, is the minimization of the dissipation of vibrational energy associated with the resonance of the resonator into the substrate (e.g. die) on which the resonator is fabricated. A high rate of vibrational energy dissipation would lower the Quality (Q) factor of the resonator, and broaden its frequency response. For most electronic circuit applications, for example for oscillator circuits, it is usually desirable to have a frequency selective component that exhibits a narrow band frequency response. Thus, it is desirable to have a MEMS resonator that does not efficiently radiate vibrational energy.

In as much as MEMS resonators comprises a sprung mass, one potential drawback is that external shocks (e.g. caused by dropping) will jar the MEMS resonator, and generate spurious transients in the signal (e.g., oscillator output) generated using the MEMS resonator. Thus, it is desirable to have a MEMS resonator that is less prone to cause spurious signal transients when jarred.

BRIEF DESCRIPTION OF THE FIGURES

FIG. 1 is a fragmentary perspective view of die including a two plate electromechanical resonator according to an embodiment of the invention.

FIG. 2 is a fragmentary plan view of the two plate electromechanical resonator shown in FIG. 1.

FIG. 3 is a perspective view of a vibrating plate that is used in electromechanical resonators according to embodiments of the invention.

FIG. 4 is a perspective view of the vibrating plate shown in FIG. 3 in a deformed state at an instant of time while vibrating in a fundamental mode.

DETAILED DESCRIPTION OF THE PREFERRED EMBODIMENTS

Figure 5:
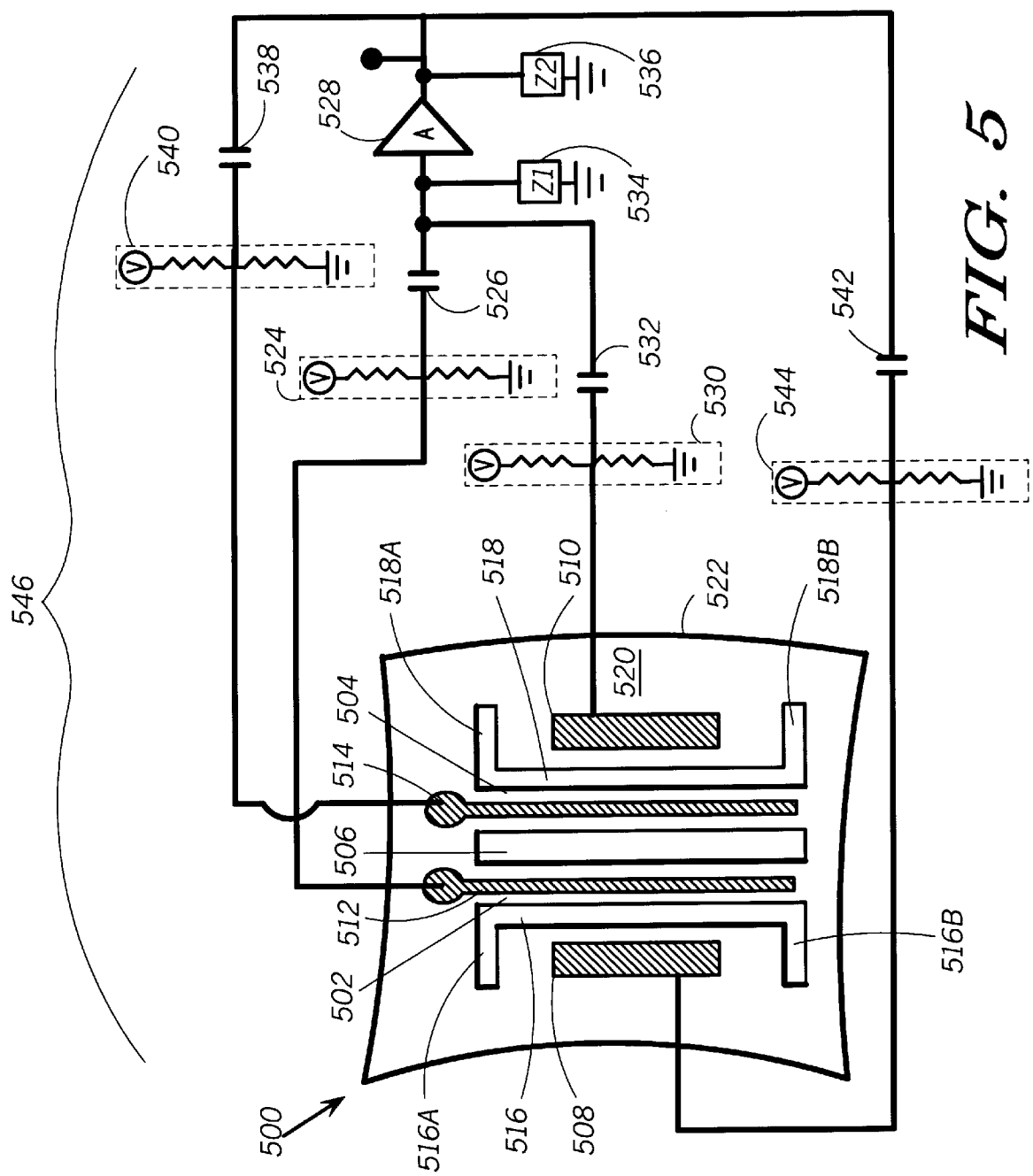
FIG. 5 is a schematic of an oscillator including a fragmentary plan view of a die including a second two plate electromechanical resonator according to an embodiment of the invention.

Referring to FIG. 1 a fragmentary perspective view of die 100 including a two plate electromechanical resonator 102 according to an embodiment of the invention is shown. The die 100 is preferably silicon which is the primary material used in microelectronic fabrication. The die 100 includes a die major surface 108 that is characterized by a die major surface normal DN. As used in the present description, the term major surface specifies a large area surface of an object as distinguished from an edge. The electromechanical resonator 102 is fabricated at the die major surface 108. Electrical components may also be fabricated on the die major surface 108 by using semiconductor lithography techniques, and coupled to the resonator 102 in order to form circuits, e.g. oscillator circuits.

The resonator 102 includes a first vibratable member in the form of a first vibratable plate 104, and a second vibratable member in the form of a second vibratable plate 106. The first vibratable plate 104 includes a first major surface 104A, that is characterized by a first vibratable plate major surface normal PN. The first vibratable plate major surface normal PN is substantially perpendicular to the die major surface normal DN. The first and second vibratable plates 104, 106 are substantially parallel to each other, i.e., their surface normals are substantially parallel. In further embodiments of the invention that are described below, the die major surface normals, are perpendicular to the vibratable plate major surface normals, and the vibratable plates in each embodiment are arranged parallel to each other. Arranging the vibratable plate normals perpendicular to the die surface normals, results in resonators that occupy a relatively small amount of area of the die major surfaces (e.g., 108) on which they are fabricated.

A first trench 110 is located between the first vibratable plate 104, and the second vibratable plate 106. A second trench 112 is located adjacent to the first vibratable plate 104 opposite the first trench 110. A third trench 114 is located adjacent to the second vibratable plate 106 opposite the first trench 110. By forming the first 110 second 112, and third 114 trenches in the die major surface, the first 104 and second 106 vibratable plates are formed. The three trenches 110–114 are preferably formed by etching, more preferably by deep anisotropic reactive ion etching (RIE). Trenches and recesses in other embodiments of the invention described below are also preferably formed by deep anisotropic etching. Due to the nature of RIE there may be a slight tapering of transverse dimensions (e.g., plate thickness) with depth.

A first conductive pathway 116 extends from the die major surface 108 along a top edge 104B of the first vibratable plate 104. (In the FIGS., conductive pathways are shown as cross hatched areas.) Similarly, a second conductive pathway 118 extends from the die major surface 108 along a top edge 106B of the second vibratable plate 106. (Portions of the fist and second conductive pathways 116, 118 that overlie the first and second vibratable plates 104, 106 serve as electrodes for establishing attractive electric fields.) The conductive pathways 116, 118, and conductive pathways in other embodiments of the invention, preferably comprise doped regions formed by selectively doping the die 100 prior to etching. Ion implantation is the preferred method for selective doping. The conductive pathways 116, 118 and conductive pathways in other embodiments of the invention may extend to a substantial depth within the vibratable plates which they overlie, relative to the height of the vibratable plates that they overlie. In order to increase the strength of the electrical force that can be established between the vibratable plates 104, 106, the conductive pathways 116, 118 preferably extend down through at least about one-third of the height of the vibratable plates 104, 106 from their top edges 104B, 106B. In other embodiments described below that include fixed electrodes, the doping used to form the fixed electrodes also preferably extends down into the substrate by a distance equal to at least about one-third of the height of the vibratable plates with which the fixed electrodes are used.

A first plug 120 is in electrical contact with the first conductive pathway 116, and a second plug 122 is in electrical contact with the second conductive pathway 118. The first and second plugs 120, 122 extend through an insulator layer 128. A first metal trace 124 is in electrical contact with the first plug 120, and a second metal trace 126 is in electrical contact with the second plug 122. The first and second metal traces 124, 126 are used to couple the resonator 102 to external circuits elements (not shown). The resonator 102 may for example be used in an oscillator circuit. Similar plugs, insulators, and conductive traces can be used to couple other resonators described below to external circuits. Plugs may be located over portions of conductive pathways that extend onto die major surfaces.

FIG. 2 is a fragmentary plan view of the two plate electromechanical resonator 102 shown in FIG. 1. In FIG. 2, the resonator is shown without the two plugs 120, 122, insulator layer 128 or metal traces 124, 126. In FIG. 2 a first contact area 116A at the end of the first conductive pathway 116, and a second contact area 118A at the end of the second conductive pathway 118 are shown. The first and second plugs 120, 122 contact the first and second contact areas 116A, 118A respectively.

An electric field that emanates from one of the vibratable plates 104, 106 and terminates in the other vibratable plate 104, 106 is established when a first voltage is applied to the first conductive pathway 116 and a second voltage is applied to the second conductive pathway 118. The electric field creates an attractive force between the first vibratable plate 104 and the second vibratable plate 106 that tends to cause the vibratable plates 104, 106 to bow towards each other.

As is known from the theory of the solid mechanics, a plate is capable of vibrating in different modes that depend on its boundary conditions. Boundary conditions for a plate specify whether each edge is free or clamped.

FIG. 3 is a perspective view of the first vibrating plate 104. The vibrating plate 104 includes the following sides: the first major surface 104A, a second major surface 104D, a first side edge 104E, a second side edge 104F, a bottom edge 104C, and the top edge 104B. Other vibratable plates shown in other embodiments of the invention described herein below include the aforementioned sides.

In the resonator 102 the first side edge 104E, the second side edge 104F, and the bottom edge 104C are attached to (i.e. contiguous with) the semiconductor die 100. For the purpose of evaluating the resonant modes of the first vibratable plate 104, the aforementioned three edges 104E, 104F, 104C are considered clamped. The top edge 104B is free. The second vibratable plate 106 is attached to the die 100 in the same way, and consequently has the same boundary conditions. Thus the first and second vibratable plates 104, 106 can support modes of vibration that are known from the fields of solid mechanics and acoustics for a plate that is clamped on three sides and free on a fourth side. In such a mode, the maximum displacement is at the center of the free (top, 104B) edge.

FIG. 4 is a perspective view of the vibrating plate shown in FIG. 3 in a deformed state at an instant of time while vibrating in a fundamental mode. The deformed state corresponds to the lowest order (frequency) mode of plate that is clamped along three sides and free on a fourth side. The first side edge 104E, second side edge 104F, and bottom edge 104C are maintained straight due to the fact that they are clamped. The top edge 104B is bowed, and the first and second major surfaces 104A, 104D are curved. A first node and a second node are located at the ends of the top edge 104B, and an antinode is located at the center of the top edge 104B. Half a vibration period later, the top edge 104B bows in the opposite direction.

Note that maximum displacement occurs along the top edge 104A that is free. Thus by locating the first and second conductive pathways 116, 118 along the top edges 104B, 106B of the first and second vibratable plates 104, 106, and applying suitable electrical signals to the first and second conductive pathways 116, 118 in order to create an attractive electrostatic force between the top edges 104A, 106A of the first and second vibratable plates, the two vibratable plates 104, 106 can be driven into the mode of vibration that is depicted at an instant of time in FIG. 4. Because the driving force due is an attractive electric force between the two vibratable plates, 104, 106, the vibratable plates 104, 106 will be driven in phase synchronism. Phase synchronism, as used in this description, means that there is a substantially fixed phase relationship between vibrations. The vibration of the first vibratable plate 104 will be one-half a vibration period delayed compared to the vibration of the second vibratable plate 106. By way of illustration, when one plate is fully deflected to the left, the other plate will be fully deflected to the right. The deformation of the second vibratable plate 106 will mirror the deformation of the first vibratable plate 104 while vibrating.

This leads to the important consequence that the stress along the juncture between the first vibratable plate 106 and the die 100 (i.e. along the first and second side edges 104E, 104F, and bottom edge 104C) is always opposite in direction to the stress along the junction of the second vibratable plate 106 and the die 100. Within the die 100, at distances away from vibratable plates 104, 106 that are large compared to the separation between the two vibratable plates 104, 106, the fact that the stresses at the junction of the two vibratable plates 104, 106 and the die 100 are in opposite directions, leads to destructive interference cancellation of the hypothetical emitted waves due to the strain associated with the stresses, and ultimately reduces the loss of vibration energy from the vibratable plates 104, 106 into the die 100. The latter increases the Q-factor of resonator 102, giving the resonator 102 a sharper frequency response. A sharp frequency response is advantageous in many resonator applications, for example in oscillator circuits. Th In order to improve extent of destructive interference, the plates 104, 106 are preferably spaced apart by a distance S indicated in FIG. 1 that is no more than about one-half the wavelength of acoustic waves in the die corresponding to the frequency of vibration of the plates 104, 106. More preferably, the vibratable plates 104, 106 are preferably spaced apart by no more than about one-quarter the aforementioned wavelength, and even more preferably by no more that about one-tenth of the aforementioned wavelength. The same rationale for closely spacing vibratable plates applies to other embodiment described herein.

The accuracy of lateral dimensions that can be achieved using RIE is better than the accuracy of depth (or height) dimension that can be achieved using RIE. As the ratio of the dimensions of the major surfaces of vibratable plates increases, the dependence of the resonant frequency of a given mode of the vibratable plate, on the larger of the foregoing dimensions becomes a weaker function. According to embodiments of the invention in which vibratable plate are clamped on along three edges, and free on the fourth, the quantity $$\frac{N \cdot H}{(2 \cdot M - 1) \cdot L}$$

is preferably at least about three.

where H is the height of the vibratable plates (e.g., the dimension measured along the first and second side edges 104E, 104F from the bottom edge 104C to the top edge 104D);

M is a first index that characterizes the vibration mode of the plate under consideration which specifies the number of nodal lines that are substantially aligned with the length dimension of the plate. (In the embodiments described herein, preferably one nodal line is located along the bottom edge of each plate, and consequently M=1.)

L is the length of the vibratable plates (e.g., the dimension measured along the top 104B and bottom 104C edges from the first side edge 104E to the second side edge 104C); and N is a second index characterizing the vibration mode of the plate under consideration which specifies the number of nodal lines that are substantially aligned with the height dimension of the plate. (In the each plate 104, 106 of resonator 102 there is one such nodal line along the side edge that is connected to the die 100.)

According to other embodiments of the invention, that included vibratable plates that are clamped along two adjacent edges, and free along the remaining two edges are the quantity:

$$\frac{(2 \cdot N - 1) \cdot H}{(2 \cdot M - 1) \cdot L}$$

is preferably at least about 3.0.

The relations between dimensions specified by the preceding two inequalities insures that the height is sufficiently large compared to the length so that the frequency of vibration is a weak function of height, and variations in the height that are due to limitations of RIE processes do not greatly effect the vibration frequency. By abiding by two preceding preferred relations, vibratable plates that can be fabricated to vibrate within a close tolerance of a preselected frequency can be manufactured, despite the limitations on depth control that are inherent in RIE processes.

Various combinations of signals for driving the resonator 102 are possible. According to an exemplary embodiment of the invention, the first conductive pathway 116 is biased to first predetermined voltage $V_{B1}$, and serves as an output of resonator 102 (the output may be taken through a DC blocking capacitor), and the second conductive pathway 118 receives an input signal $V_{S1}=V_{B2}+V_O*\mathrm{Sin}(\omega t)$ where $V_{B2}$ is a second predetermined biasing voltage, $V_O$ is a predetermined signal voltage, and $\omega$ is a predetermined driving frequency. The predetermined driving frequency $\omega$ corresponds to the frequency of the lowest order mode.

$V_{B2}-V_O$ is preferably greater than or equal to $V_{B1}$ so as to insure that the difference between the bias voltages ($V_{B1}-V_{B2}$) on the vibratable plates 104, 106 is greater than the signal voltage magnitude $V_O$ throughout the input signal period. Abiding by the preceding preferred relation between the voltages reduces a type of rectification effect that causes the plates to be driven non-sinusoidally at twice the predetermined drive frequency. This is explained as follows, the attractive force between the first and second vibratable plates depends on the magnitude of the voltage difference between them, but not on the sign. If as the voltage difference between the two vibratable plates 104, 106 decreased it passed through zero, the force between the two vibratable plates 104, 106 would start to increase rather than continue to decrease. This result in the attractive force having two minimums and two maximums during each period of the driving frequency. The latter would increase the magnitude of undesired electrical driving force components (e.g., a component at twice intended frequency). Even if the voltage magnitudes are selected as indicated above, to minimize the rectification effect, there is a harmonic force component at twice the predetermined frequency. This due to the fact that the electrostatic attractive force between adjacent vibratable plates is proportional to the square of the voltage difference between them. Squaring the sinusoidal term gives rise to higher harmonics.

The biases and driving signals discussed herein are proffered in contemplation of embodiments that use a P-doped die that is selectively N-doped to form conductive pathways and electrodes. For embodiments that have a N-doped wafer on which conductive pathways and electrodes are formed by selective P-doping, biases and potentials should be selected with an eye toward avoiding shorts that would arise from forward biasing PN junctions formed between fixed electrodes or conductive pathways and the die.

The resonator 102 is advantageously used in oscillator circuits in lieu of a quartz resonator which is normally used for establishing a frequency of the oscillation.

The resonator may be used in signal processing, i.e. to perform frequency selective filtering. The resonator 102, and other resonators described herein below have the advantage over quartz resonators, that they can be fabricated on a die along with other circuit components using established techniques used in the semiconductor fabrication industry (e.g. RIE). Quartz resonators, on the other hand, are costly, bulky discrete components.

FIG. 5 is a schematic of an oscillator 546 including a fragmentary plan view of a major surface 520 of a die 522 including a second two plate electromechanical resonator 500 according to an embodiment of the invention.

Similarly to the resonator 102 shown in FIG. 1, the second resonator 500 comprises a first vibratable plate 502, a second vibratable plate 504, a first trench 506 that is located between the first vibratable plate 502 and the second vibratable plate 504, a second trench 516 that extends adjacent to the first vibratable plate 502 opposite the first trench 506, a third trench 518 that extends adjacent to the second vibratable plate 504 opposite the first trench 506, a first conductive path 512 onto the first vibratable plate 502, and a second conductive path 514 onto the second vibratable plate 504.

In this embodiment and in other embodiments described herein below, portions of the conductive pathways on the die major surface are used as ohmic contact areas for connecting the resonators to external circuits. The doping in the areas used as ohmic contacts is preferably increased by a second ion implantation process.

The second resonator 500 further comprises a first fixed electrode 508 located on a side of the first vibratable plate 502 opposite the second vibratable plate 504. The second trench 516 extends between the first fixed electrode 508 and the first vibratable plate 502. A second fixed electrode 510 is located on a side of the second vibratable plate 504 opposite the first vibratable plate 502. The third trench 518 extends between the second vibratable plate 504, and the second fixed electrode 510.

The second trench 516 includes a first isolation leg 516A that extends in a direction away from the first vibratable plate 502 on a first side (top in FIG. 5 plan view) of the first fixed electrode 508. The second trench 516 also includes a second isolation leg 516B that extends in the direction away from the first vibratable plate 502 on a second side (bottom in FIG. 5 plan view) of the first fixed electrode 508. The first and second isolation legs 516A, 516B serve to electrically isolate the first fixed electrode from the first conductive pathway 512. The first fixed electrode 508 is preferably formed by selectively doping the die major surface 520. Although shown as a sharply demarcated rectangle, in practice dopant density is a continuous function of position. Doping is preferably performed using in an ion implantation step that is ordinarily followed up by an annealing step. The annealing step may cause unwanted diffusion of dopants that could lead to a parasitic conductance between the first fixed electrode 508, and the first conductive pathway 512. The first and second isolation legs 516A and 516B serve to interrupt parasitic conductance that might have occurred due to dopant diffusion.

Similarly, the third trench 518 includes a third isolation leg 518A that extends away from second vibratable plate 504 on a first side of the second fixed electrode 510 and a fourth isolation leg 518B that extends in the direction away from the second vibratable plate on a second side of the second fixed electrode 510.

The resonator 520 is preferably driven as follows. A signal of the form $V_{B1}+V_O*\sin(\omega t)$ is applied to the first fixed electrode 508, the first conductive pathway 512 is biased to $V_{B2}$, a signal of the form $V_{B3}+V_O*\sin(\omega t)$ is applied to the second conductive pathway 514, and the second fixed electrode 510 is biased to $V_{B4}$, where $V_{B1} \leq V_{B2} \leq V_{B3} \leq V_{B4}$, $V_O \leq V_{B4}-V_{B3}$, $V_O \leq V_{B3}-V_{B2}$ and $V_O \leq V_{B2}-V_{B1}$.

In this case the ratios of successive bias differences (Vb2−Vb1):(Vb3−Vb2):(Vb4−Vb3) are preferably about 1:0.6:1. The latter preference arises from a requirement that the forces on the two vibratable plates 502, 504 be balanced when the periodic signal component is zero. The aforementioned ratios were determined based on the assumption of equal widths of the three trenches 506, 516, 518 and a simplified model of the electrostatic attraction among the fixed electrodes 508, 50 and the vibratable plates 502, 504. By selecting biases such that the forces on the vibratable plates 502, 504 are balanced, the biases can be set to high values (relative to the sinusoidal signal amplitude, $V_O$) without causing a high static deflection of the vibratable plates 502, 504, e.g., deflection to the point of contact. By selecting biases and the sinusoidal signal amplitude such that the biases are large compared to the sinusoidal signal amplitude, the magnitude of undesired high frequency harmonics in the driving force are reduced relative to the magnitude of the desired driving force component.

When the periodic signal component $\sin(\omega t)$ is removed and only the biases applied the two vibratable plates 504, 506 will be in their rest position, the forces on the two vibratable plates 502, 504 will be approximately balanced. When the periodic signal is applied, the forces driving the vibratable plates 502, 504 will be symmetric. Biases selected to balance the forces on the vibratable plates 502, 504 along with periodic signal components selected to drive the vibratable plates 502, 504 symmetrically allow for symmetric signals to be generated using the resonator 500.

According to an alternative embodiment, the two conductive pathways 512, 514 are biased to $V_{B1}$ volts, and the two fixed electrodes 508, 510 are coupled to a signal of the form $V_{S2}=V_{B2}+V_O*\sin(\omega t)$, where $|V_{B1}-V_{B2}| \geq V_O$. According to an alternative embodiment, the connections of the fixed electrodes 508, 510 are switched with the connections of the conductive pathways 512, 514.

According to another alternative embodiment, the first fixed electrode 508 is biased to $V_{B1}$ volts. The first conductive pathway 512 is coupled to a signal $V_{S2}=V_{B2}+V_O*\sin(\omega t)$, where $|V_{B1}-V_{B2}| \geq V_O$. The second fixed electrode 510 is biased to $V_{B3}$ volts, where $V_{B3}$ is preferably greater than or equal to $V_{B2}+V_O$, and more preferably about equal to $2V_{B2}-V_{B1}$. The second conductive pathway 514 is coupled to a voltage $V_{S3}=V_{B2}-V_O*\sin(\omega t)$.

The first conductive pathway 512, and second fixed electrode 510 may be used as differential inputs to the resonator 500. For example, the sinusoidal term in $V_{S3}$ in the latter embodiment may be obtained from the sinusoid in $V_{S2}$, by passing the latter through an inverter. The biases would then be added to $V_{S2}$ and $V_{S3}$ and the resulting signals applied to the first conductive pathway 502, and the second fixed electrode 510. The first fixed electrode 508 and the second conductive pathway 504 may be used as two outputs coupled to two differential inputs of a differential amplifier.

The oscillator 546 comprises electrical components in addition to the resonator 500. The circuit configuration shown in FIG. 5 is suitable driving oscillator 520 with the signals and biases described above as a preferred embodiment. Although shown schematically for the purpose of illustration, it is noted that the electrical components are preferably fabricated on the die major surface 704 by methods known to persons of ordinary skill in the semiconductor fabrication art. The oscillator 546 circuit is configured as follows. The first conductive pathway 512 is coupled through a first voltage divider 524, and a first DC blocking capacitor 526 to an input of an amplifier 528. The second fixed electrode 510 is coupled through a second voltage divider 530, and a second DC blocking capacitor 532 to the input of the amplifier 528. A first impedance network 534, which preferably comprises a resistor and a capacitor in parallel, is coupled between the input of the amplifier and ground. A second impedance network 536, which also preferably comprises a resistor and a capacitor in parallel is coupled between an output of the amplifier 528 and ground. The output of the amplifier 528 is coupled through a third DC blocking capacitor 538 and a third voltage divider 540 to the second conductive pathway 514. The output of the oscillator 528 is also coupled through a fourth DC blocking capacitor 542, and a fourth voltage divider 544 to the first fixed electrode 508.

The four voltage dividers 524, 530, 540, 544 are used as biasing circuits to bias the two fixed electrodes 508, 510 and two conductive pathways 512, 514. The four DC blocking capacitors 526, 532, 538, 542 serve to isolate the amplifier 528 from the bias voltages. The first and second impedance networks 534, 536 serve to load the input and output of the amplifier, and aid in sustaining oscillation, of the oscillator 546. The output of the amplifier 528 serves as the output of the oscillator 546.

In operation regenerative feedback is coupled from the output of the amplifier 528 through the resonator 500 to the input of the amplifier causing the oscillator 546 to oscillate.

Figure 6:
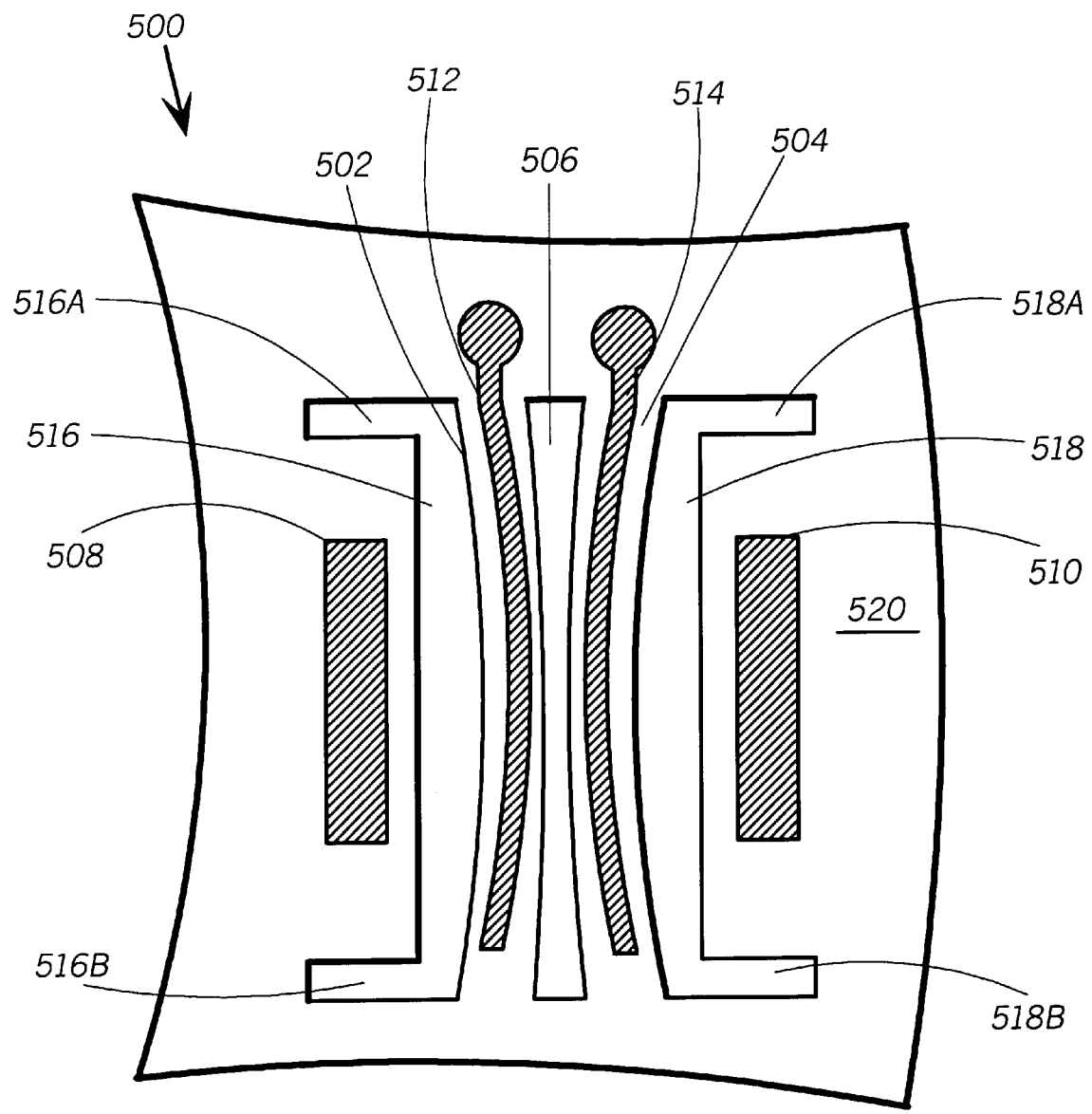
FIG. 6 shows the electromechanical resonator shown in FIG. 5 during operation.

FIG. 6 shows the electromechanical resonator 500 shown in FIG. 5 during operation. The vibratable plates 504, 506 are shown at an instant in time while vibrating. At the instant shown, the vibratable plates 504, 506 are bowed toward each other.

Figure 7:
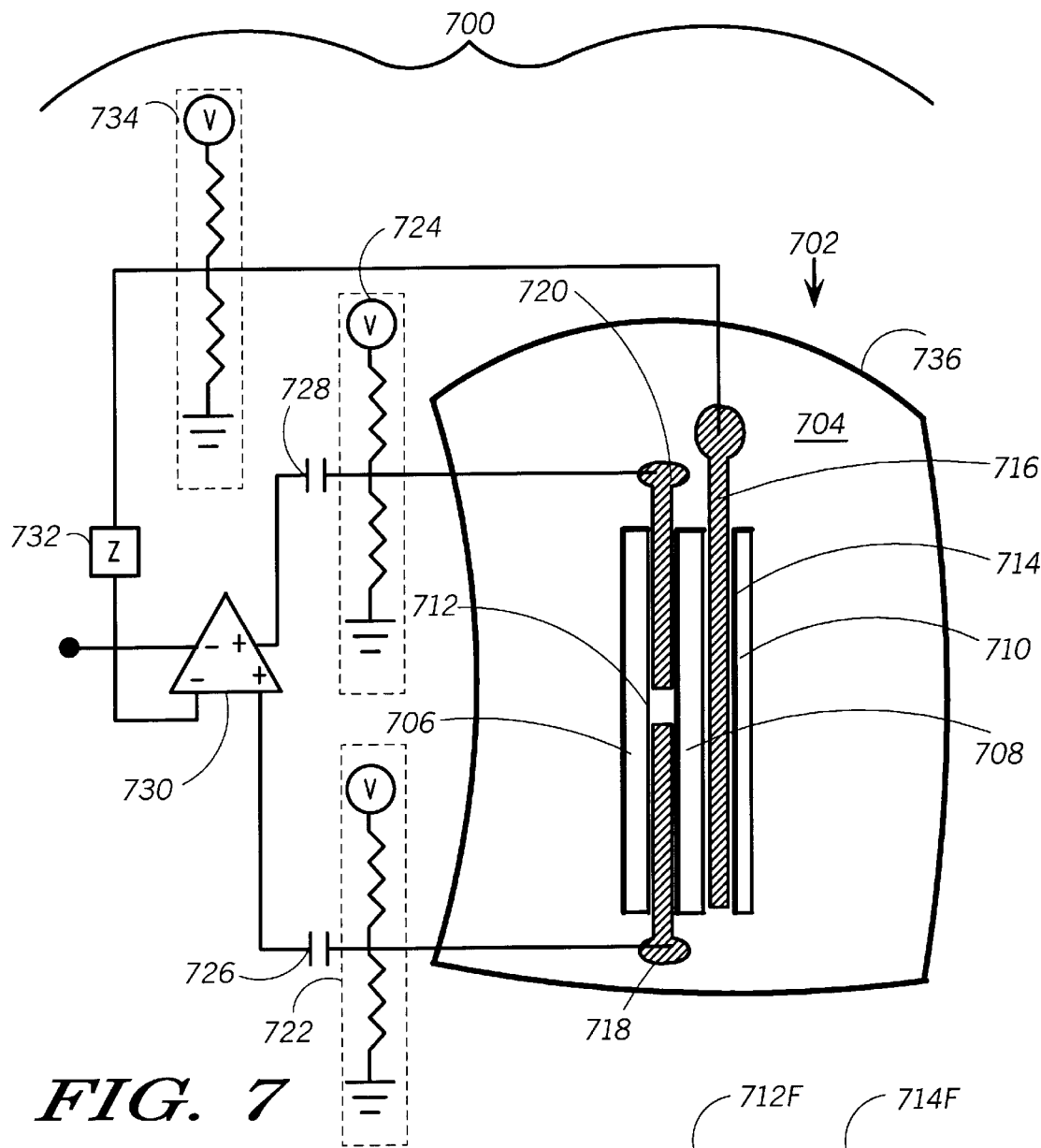
FIG. 7 is schematic illustration of an oscillator including a fragmentary plan view of a major surface of a die including a third two plate electromechanical resonator according to an embodiment of the invention.

FIG. 7 is schematic illustration of an oscillator 700 including a fragmentary plan view of a major surface 704 of a die 736 including a third two plate two plate electromechanical resonator 702 according to an embodiment of the invention.

A first vibratable plate 712 is located between a first trench 706, and a second trench 708. A second vibratable plate 714 is located between the second trench 708, and a third trench 710.

First 718, and second 720 conductive pathways extends from the die major surface 704 near opposite ends of the first vibratable plate 712 toward but not to a midpoint of the first vibratable plate 712. A third conductive pathway 716 extends from the die major surface 704 substantially along the entire length of the second vibratable plate 714. The three conductive pathways 716, 718, 720 are preferably formed by patternwise doping the die major surface 704 prior to etching the three trenches 706, 708, 710. If the background doping of the die 736 is of one type (i.e., N or P) and the first and second conductive pathways 718, 720 are formed by implanting a dopant of the second type, there will be one reversed biased junction isolating the first and second conductive pathways 718, 720 near the midpoint of the first vibratable plate 712.

Portions of the conductive pathways 716, 718, 720 overlying the vibratable plates 710, 712 serve as electrodes between which attractive electric fields are established for driving the vibratable plates 710, 712 into vibration.

The bias applied to the third conductive pathway 716 is preferably between the biases applied to the first 718 and second 720 conductive pathways 718, 720. A periodic signal component, may be added to the bias of the third conductive pathway 716 in order to drive the vibratable plates 718, 720 into vibration. The amplitude of the periodic component is preferably selected so that the voltage on the third conductive pathway 716 never goes beyond a voltage range bounded by the biases on the first and second conductive pathways 718, 720.

If the periodic signal component were zero, there would be a static attractive electric forces between the third conductive pathway 716, and the first and second conductive pathways 718, 720. In operation as the total voltage (bias plus the periodic component) on the third conductive pathway 716 approaches the bias on the first conductive pathway 718, the attractive force between the second vibratable plate 1714 and the first conductive pathway 718 will decrease. At the same time, because, the bias on the second conductive pathway 720 is preferably fixed, a voltage difference between the second 720 and third conductive pathways 716 will increase and the attractive force between the second 720 and third 716 conductive pathways will also increase. The effect on the attractive forces is reversed if the total voltage on the third conductive pathway 716 swings in the opposite direction. By applying the periodic signal component to the third conductive pathway 716, the first and second vibratable plates 712, 714 are driven to vibrate in an antisymmetric vibration mode.

Figure 8:
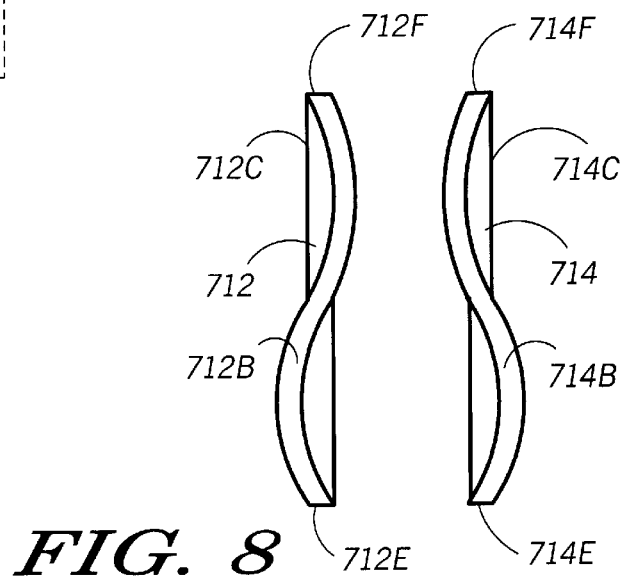
FIG. 8 is a top view of the two plates of the resonator shown in FIG. 7 at an instant of time while vibrating.

FIG. 8 is a top view of the two vibratable plates 712, 714 of the resonator shown in FIG. 7 at an instant of time while vibrating. Because the two vibratable plates 712, 714 are driven by the same attractive electrical forces they resonate in phase synchronism. Note also that the two plates 712, 714 mirror each other while vibrating. The bottom edges 712C, 714C, first side edges 712E, 714E, and second side edges 712F, 714F remain straight because they are clamped (due to the fact that they are connected with the die 736). The top edges 712B, 714B assume a sine function like shape. In contrast to the embodiments shown in FIGS. 1 and 5, the vibration mode of the first and second plates 712, 714 depicted in FIG. 8 is not the lowest order mode of the vibratable plates 712, 714.

Referring again to FIG. 7, various electrical components that are, in addition to resonator 702, part of the oscillator 700 will be described. Although shown schematically for the purpose of illustration, it is noted that the electrical components are preferably fabricated on the die major surface 704 by methods known to persons of ordinary skill in the semiconductor fabrication art. First 722 and second 724 voltage dividers are used to set bias voltages on the first 718 and second 720 conductive pathways respectively. The first conductive pathway 718 is also coupled through a first DC blocking capacitor 726 (to block the bias voltage) to a non-inverting input of a differential amplifier 730. The second conductive pathway 720 is coupled through a second DC blocking capacitor 728 to a non-inverting output of the differential amplifier 730. An inverting output of the amplifier is coupled through an impedance device 732 to the third conductive pathway 716. The impedance device 732 serves to control the amount of feedback in the oscillator 700. An inverting input of the differential amplifier 730 is coupled to the inverting output. A third voltage divider 734 is coupled to the third conductive pathway 716 for biasing the third conductive pathway 724. The outputs of the amplifier 730 serves as the oscillator 700 outputs.

Regenerative feedback passes from the amplifier's 730 outputs to the amplifiers inputs through the resonator 700, causing the oscillator 700 to oscillate.

The resonator 702 is relatively immune to external shocks that could be caused when an electronic device that uses the oscillator 700 is jolted. This is due to the fact that an external shock or vibration would cause the a bowing of the vibratable plates 712, 714 to be superimposed on the normal vibration. The bowing might lead to a spurious common mode signal appearing on the first 718, and second 720 conductive pathways, but the latter would be rejected by the amplifier 730.

Although one particular oscillator circuit 700 has been described with reference to FIG. 7, it is noted that the resonator 702 is useful for a variety of electrical circuits that require frequency selective components.

Figure 9:
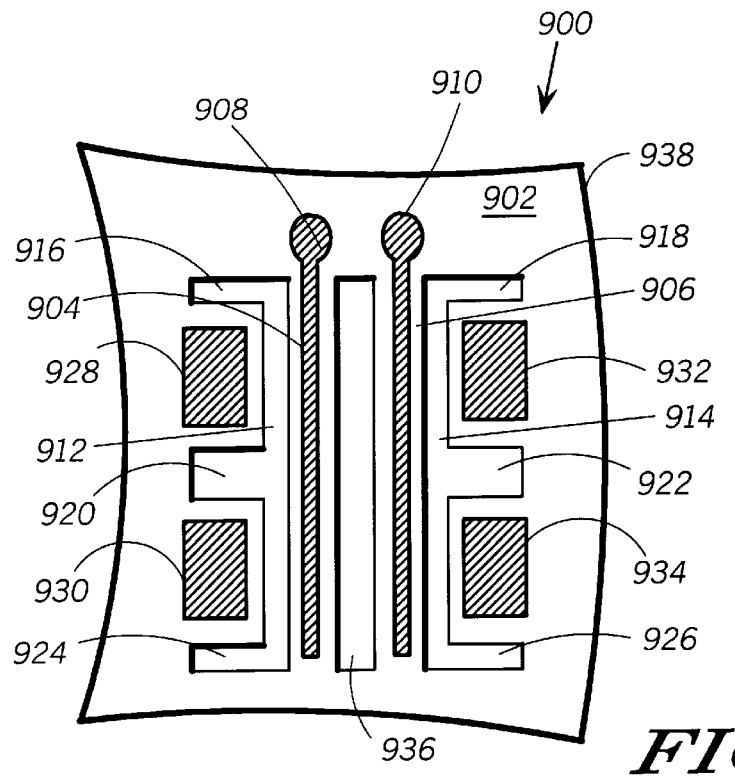
FIG. 9 is a plan view of a fourth two plate electromechanical resonator according to an embodiment of the invention.

FIG. 9 is a plan view of a fourth two plate electromechanical resonator 900 according to an embodiment of the invention. The fourth resonator 900 is fabricated on a major surface 902 of a die 938. A first vibratable plate 904 is located between a first trench 912 and a second trench 936. A second vibratable plate 906 is located between the second trench 936 and a third trench 914. The first and second vibratable plates 904, 906 of the fourth resonator 900 vibrate in the mode depicted in FIG. 8.

A first conductive pathway 908 extends from the die major surface 902 along the length of the top edge of the first vibratable plate 904, and a second conductive pathway 910 extends from the die major surface 902 along the length of the top edge of the second vibratable plate 906.

A first fixed electrode 928, and a second fixed electrode 930 are positioned side by side, adjacent to the first trench 912, opposite the first vibratable plate 904. Similarly a third fixed electrode 932 and a fourth fixed electrode 934 are located adjacent to each other, and adjacent to the third trench 914 opposite the second vibratable plate 906. The first trench 912 includes a first isolation leg 920 that extends between the first 928 and second 930 fixed electrodes, a second isolation 916 leg that extends away from the first vibratable plate 904, along the side of the first fixed electrode, opposite to the first isolation leg 920, and a third isolation leg 924 that extends along the side of the second fixed electrode 930 opposite the first isolation leg 920. The three isolation legs 916, 920, 924 serve to electrically isolate the first and second fixed electrodes 928, 930 from each other and from the first conductive pathway 908. Similarly, the third trench includes three isolation legs 918, 922, 926 to isolate the third 932 and fourth 934 fixed electrodes.

According to an embodiment of the invention, the fourth resonator 900 is operated by coupling a first bias voltage $V_{B1}$ to the first and second conductive pathways 908, 910 and coupling a first signal of the form $V_{S1}=V_{B2}+V_O*\text{Sin}(\omega t)$ to the first and third fixed electrodes 928, 932, and a second signal of the form $V_{S3}=V_{B2}-V_O*\sin(\omega t)$ where $V_{B1}<V_{B2}-V_O$ to the second and fourth fixed electrodes 930, 934. Using such signals the first and second vibratable plates 904, 906 are driven to vibrate in the vibration mode depicted in FIG. 8.

An alternative way to connect the fourth resonator 900 to a circuit is to use the first 928 and fourth 934 fixed electrodes as differential inputs of the resonator 900, and the second 930, and third 932 fixed electrodes as differential outputs of the resonator 900.

Figure 10:
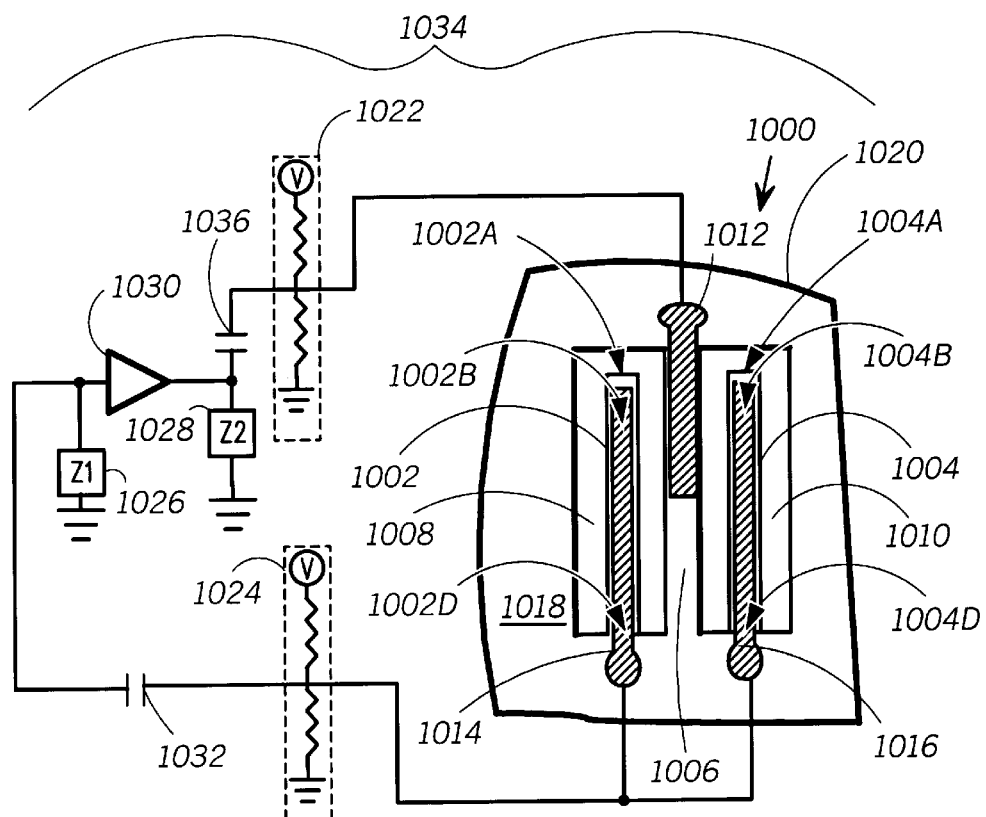
FIG. 10 is a schematic illustration of an oscillator including a plan view of a fifth two plate electromechanical resonator according to an embodiment of the invention.

FIG. 10 is a schematic illustration of an oscillator 1034 including a plan view of a fifth two plate electromechanical resonator 1000 according to an embodiment of the invention. The fifth resonator 1000 is fabricated at the major surface 1018 of a semiconductor die 1020. The fifth resonator 1000 comprises a first U-shaped trench 1008 located about a first vibratable plate 1002, and a second U-shaped trench 1010 located about a second vibratable plate 1004. A first end edge 1002A of the first vibratable plate 1002, and a first end edge 1004A of the second vibratable plate 1004 are free. Bottom edges (See FIG. 3), and second side edges 1002D, 1004D of the first and second vibratable plates 1002, 1004 are connected to (contiguous with) the semiconductor die 1020. The top edges 1002B, 1004B of the first and second vibratable plates 1002, 1004 are also free.

A separator plate 1006 separates the first U-shaped trench 1008, from the second U-shaped trench 1010. In operation the forces on the separator 1006 are substantially balanced so that the separator 1006 does vibrate significantly.

A first conductive pathway 1014 extends from the die major surface 1018 along a top edge 1002B of the first vibratable plate 1002. A second conductive pathway 1016 extends from the die major surface 1018 along a top edge 1004B of the second vibratable plate 1004. A third conductive pathway 1012 extends from the die major surface 1018 on the side of the free first end edges 1002A, 1004A of the first and second vibratable plates 1002, 1004, onto, and down about half the length of the separator plate 1006. The third conductive pathway serves as a fixed electrode. The purpose of stopping about half way along the separator 1006 is to concentrate electric fields that are established using the third conductive pathway 1012 near the free first end edges 1002A, 1004A of the first and second vibratable plates 1002, 1004. Spatially controlling the electric fields is useful in selectively driving a predetermined vibration mode of the first and second vibratable plates 1002, 1004.

Figure 11:
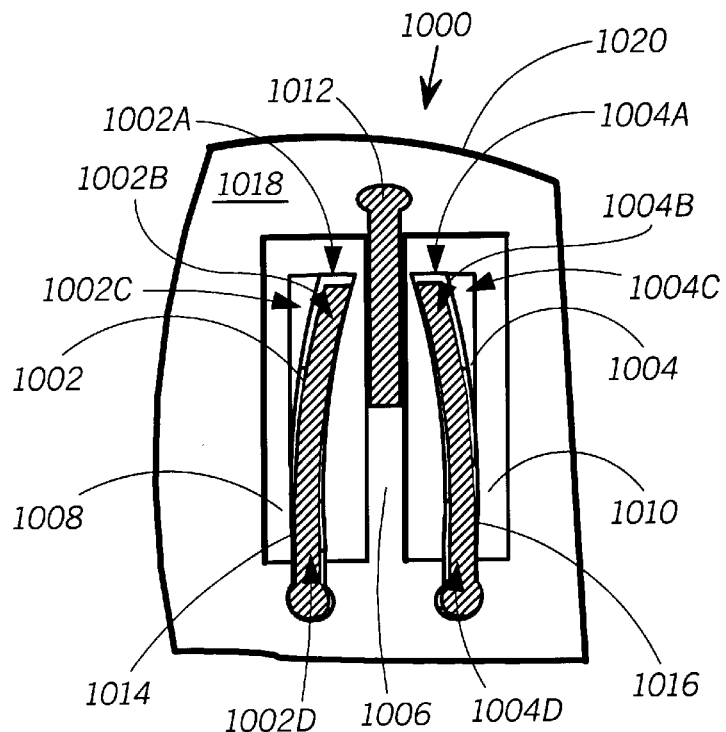
FIG. 11 is a plan view of the fifth resonator showing the two plates in a deflected state at an instant of time while operating.

The vibrational modes available to the first and second vibratable plates 1002, 1004 are the modes available to a plate that is clamped on two adjacent edges, and free on two adjacent edges. In the fifth resonator 1000, the first and second vibratable plates 1002, 1004 are drive to vibrate in the fundamental (lowest frequency) mode consistent with their boundary conditions. FIG. 11 is a plan view of the fifth resonator 1000 showing the two plates 1002, 1004 at an instant of time, while vibrating in the fundamental mode. As shown in FIG. 11, in the illustrated fundamental mode the top edges 1002B, 1004B of the first and second vibratable plates are bowed inward. There is a single node, along the top edge 1002B, 1004B of each vibratable plate 1002, 1004 where the top edges 1002B, 1004B meet the second side edges 1002D, 1004D. The first side edges 1002A, 1004A are also bowed inward. Major surfaces 1002C, 1004C of the first and second vibratable plates 1002, 1004 are curved. One half a period of vibration later, the two vibratable plates 1002, 1004 would be deflected in the opposite direction.

During operation of the fifth resonator 1000, a periodic transverse strain at the second side edge 1002D and bottom edge (not shown) of the first vibratable plate 1002 is one-half a vibration period out of phase with a periodic transverse strain that is present at the second side edge 1004D and the bottom edge (not shown) of the second vibratable plate 1004. The first and second vibratable plates 1002, 1004 are preferably separated by less than one-half the wavelength of acoustic waves in the die that corresponds to the frequency at which the vibratable plates 1002, 1004 vibrate. More preferably, the vibratable plates are preferably separated by less than one-quarter the aforementioned wavelength, and even more preferably by less than one-tenth the aforementioned wavelength. Consequently, in the far field, the disturbances caused by the two periodic transverse stresses tend to cancel each other, such that the amount of vibrational energy radiated from the two vibratable plates 1002, 1004 into the die 1020 is reduced.

One way of driving the fifth resonator 1000 is to couple a first bias $V_{B1}$ to the first and second conductive pathways 1014, 1016, and to apply a signal of the form $V_{S1}=V_{B2}+V_o*\mathrm{Sin}(\omega t)$, where $|V_{B1}-V_{B2}| \geq V_O$, to third conductive pathways 1012. In such an arrangement the first and second conductive pathways 1014, 1016 may also be used as output terminals of the resonator 1012. It may be desirable to couple the output through a DC blocking capacitor in order to block the bias voltage $V_{B1}$ from reaching a circuit coupled to the output.

Additional electrical components are used in conjunction with the resonator 1000 in the oscillator 1034. A first voltage divider 1024 is coupled to the first and second conductive pathways 1014, 1016 for setting the first bias. The first and second conductive pathways 1014, 1016 are also coupled through a first DC blocking capacitor 1032 to the input of an amplifier 1030. A first impedance device 1026 is also coupled to the input of the amplifier 1030. The first impedance device 1026 may for example comprise a parallel network of a resistor and capacitor. A second impedance device 1028 loads an output of the amplifier 1030. The output of the amplifier 1030 is coupled through a second DC blocking capacitor 1036 to the third conductive pathway 1012. A second voltage divider 1022 is coupled to the third conductive pathway 1012 for the purpose of setting the bias on the third conductive pathway 1012.

In operation regenerative feedback passes from the output to the input of the amplifier 1030 through the resonator 1000, causing the oscillator 1034 to oscillate at a frequency at which the first and second 1002, 1004 vibratable plates vibrate.

According to an alternative embodiment the first bias $VB_1$ is applied to the third conductive pathways 1012, and the signal $V_{S1}=V_{B2}+V_o*\mathrm{Sin}(\omega t)$ is applied to the first and second conductive pathway 1012.

Figure 12:
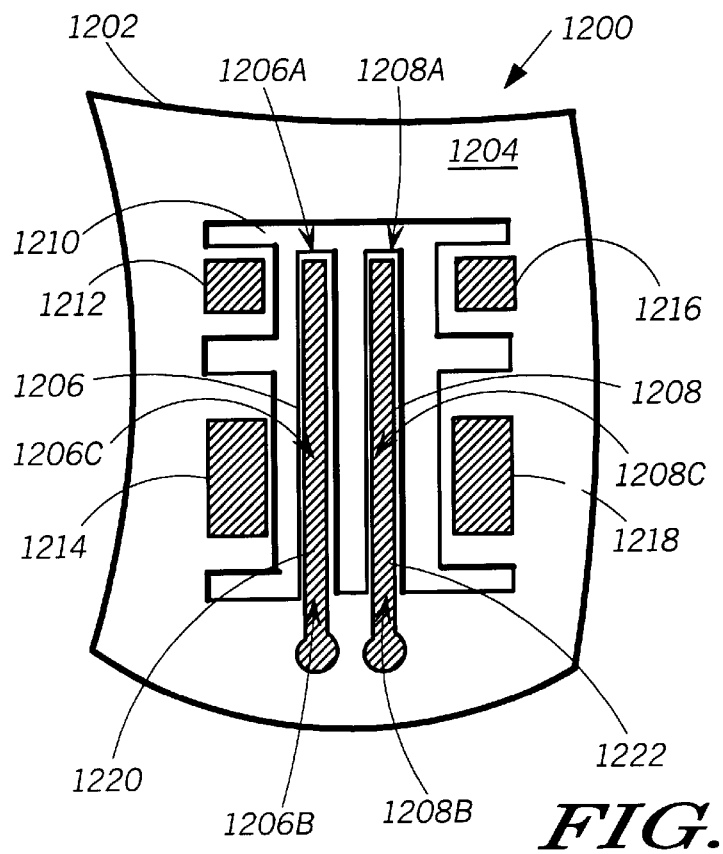
FIG. 12 is a plan view of a sixth two plate electromechanical resonator according to an embodiment of the invention.

FIG. 12 is a plan view of a sixth two plate electromechanical resonator 1200 according to an embodiment of the invention. The sixth resonator 1200 is fabricated at a major surface 1204 of a die 1202.

A multi-branched trench 1210 separates and partially surrounds a first vibratable plate 1206 and a second vibratable plate 1208. The first 1206 and second 1208 vibratable plates include free first end edges 1206A, 1208A, and free top edges 1206C, 1208C, second end edges 1206B, 1208B that are connected to (contiguous with) the die 1202, and bottom edges (not visible) that are located below the free top edges 1206C, 1208C and are connected to (contiguous with) the die 1202. Thus, the boundary conditions of each of the vibratable plates 1206, 1208 is that they are clamped along two adjacent edges and free along the remaining two edges.

Figure 13:
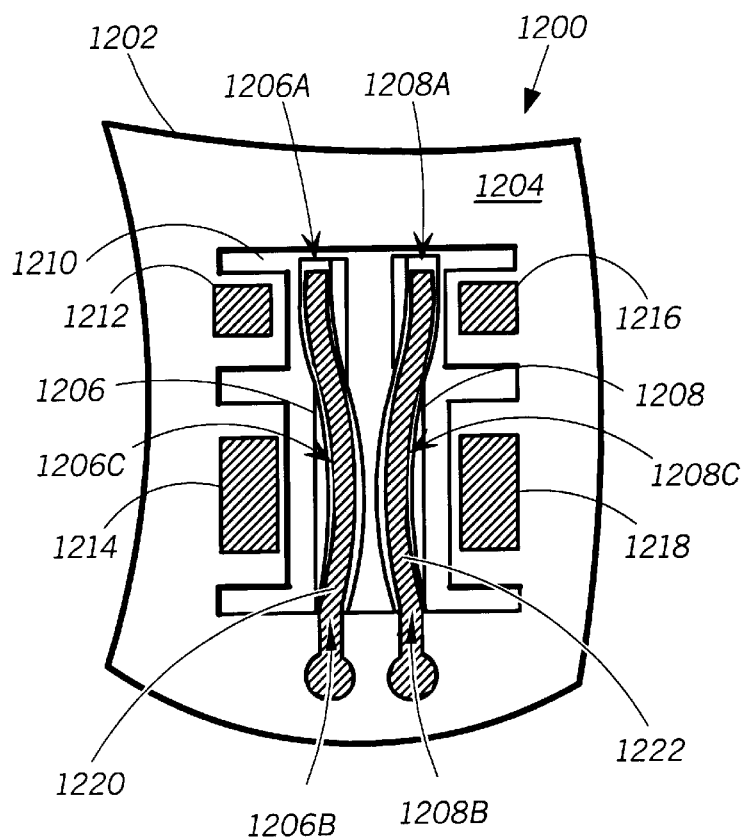
FIG. 13 is a plan view of the sixth resonator showing the two plates in a deflected state at an instant of time while the sixth resonator is operating.

Although the first and second vibratable plates 1206, 1208, may in principle vibrate in any vibration mode that is consistent with their boundary conditions, the frequency and spatial arrangement of electric forces used to drive their vibration is such that they vibrate in mode in which the top edges 1206C, 1208C assume a contour that includes two nodes and two anti-nodes. The free first end edges 1206A, 1208A assume a shape that includes one or more nodes and one or more anti-nodes, depending on the height of the vibratable plates 1206, 1208. FIG. 13 is a plan view of the sixth resonator 1200 showing the two vibratable plates 1206, 1208 in a deflected state at an instant of time while operating. As shown in FIG. 13 the two plates mirror each other as they vibrate. The symmetry of the vibration of the two plates leads to destructive interference within the die 1202 and suppression of radiation of acoustic energy from the two vibratable plates 1206, 1208.

A first fixed electrode 1212 and a second fixed electrode 1214 are located adjacent to each other on the die major surface 1204 on a side (left side in FIG. 12) of the first vibratable plate 1206. The multi-branched trench 1210 extends between the first vibratable plate 1206, and the first 1212 and second 1214 fixed electrodes. The first fixed electrode 1212 is located near the free first end edge 1206A of the first vibratable plate 1206, whereas the second fixed electrode 1214 is located near the second end edge 1206B of the first vibratable plate 1206. A third fixed electrode 1216 and a fourth fixed electrode 1218 are located adjacent to each other on the die major surface 1204 on a side (right side in FIG. 12) of the second vibratable plate 1208. The multi-branched trench 1210 also extends between the second vibratable plate 1208 and the third 1216 and fourth 1218 fixed electrodes. The third fixed electrode 1216 is located near the free first end edge 1208A of the second vibratable plate 1208, whereas the fourth fixed electrode is located near the second end edge 1208B of the second vibratable plate 1208.

The vibration modes of each of the first and second vibratable plates 1206, 1208 include two nodal lines substantially aligned with their heights. First nodal lines are located at the second end edges 1206B, 1208B, and second nodal lines are located approximately two-thirds of the way from the second end edges 1206B, 1208B to the first end edges 1206A, 1208A. The second 1214 and fourth 1218 fixed electrodes are relatively long so as to form an electrostatic field that acts over a substantial portion of the area between the first and second nodal lines. On the other hand, the first 1212, and third 1216 fixed electrodes are made smaller in proportion to the distance between the second nodal lines and the first end edges 1206A, 1208A that they face.

The vibration modes of the first and second vibratable plates 1206, 1208 may comprise one or more nodal lines that are substantially aligned with their lengths, but preferably comprise exactly one such nodal line located along the bottom edges.

A first conductive pathway 1220 extends from the die major surface 1204 along the length of the top edge 1206C of the first vibratable plate 1206. A second conductive pathway 1222 extends from the die major surface 1204 along the length of the top edge 1208C of the second vibratable plate 1208.

A preferred way of driving the sixth resonator 1200 is to couple a first bias $V_{B1}$, to the first conductive pathway 1220, couple a second bias $V_{B2}$, to the second conductive pathway 1222, couple a signal of the form $V_{S1}=V_{B2}+V_O^*Sin(\omega t)$, where $|V_{B1}-V_{B2}| \geq V_O$ to the first fixed electrode 1212, couple a signal of the form $V_{S2}=V_{B2}-V_O^*Sin(\omega t)$ to the second fixed electrode 1214, couple a signal of the form $V_{S3}=V_{B1}-V_O^*Sin(\omega t)$ to the third fixed electrode 1216, and couple a signal of the form $V_{S4}=V_{B1}+V_O^*Sin(\omega t)$ to the fourth fixed electrode 1218.

By way of illustration, the forces acting on the first vibratable plate 1206 will be described. The forces on the second vibratable plate 1208 are symmetric to those acting on the first vibratable plate 1206.

When the periodic signal component $Sin(\omega t)$ is zero, the potential difference between the first vibratable plate 1206 and the first fixed electrode 1212 is equal to the potential difference between the first vibratable plate 1206 and the second vibratable plate 1208. A first attractive electric force that is associated with the potential difference between the first vibratable plate 1206 and first fixed electrode 1212 will exert a pull toward the first fixed electrode 1212, on the first vibratable plate 1206 near the free first end edge 1206A, and a second attractive electric force that is associated with the potential difference between the first vibratable plate 1206 and the second vibratable plate 1208 will exert a pull toward the second vibratable plate 1208 on the first vibratable plate near the free end edge 1206A.

In the same manner counteracting attractive electrical forces that are associated with the potential difference between the first vibratable plate 1206 and the second vibratable plate 1208 and with the potential difference between the first vibratable plate 1206 and the second fixed electrode 1214 act on the first vibratable plate closer to the second end edge 1206B.

When the periodic signal component $Sin(\omega t)$ is positive, the potential difference, and attractive force between the first fixed electrode 1212 and the first vibratable plate 1206 will increase, and the potential difference and attractive force between the second fixed electrode 1214 and the first vibratable plate 1206 will decrease. When the periodic signal component $Sin(\omega t)$ is negative the magnitude of the attractive forces will be changed in the opposite way.

Thus, during each period of the periodic signal component $Sin(\omega t)$ a first periodic driving force acts on the first vibratable plate 1206 near the first end edge 1206A, and a second periodic driving force that is one-half a cycle out of phase with the first periodic driving force acts on the first vibratable member 1206 near the second end edge 1206B. As mentioned above symmetric periodic forces act on the second vibratable plate 1208. These periodic forces cause the first and second vibratable plates 1206, 1208 to vibrate in the vibration mode that is described above and illustrated, at an instant of time, in FIG. 13.

Figure 14:
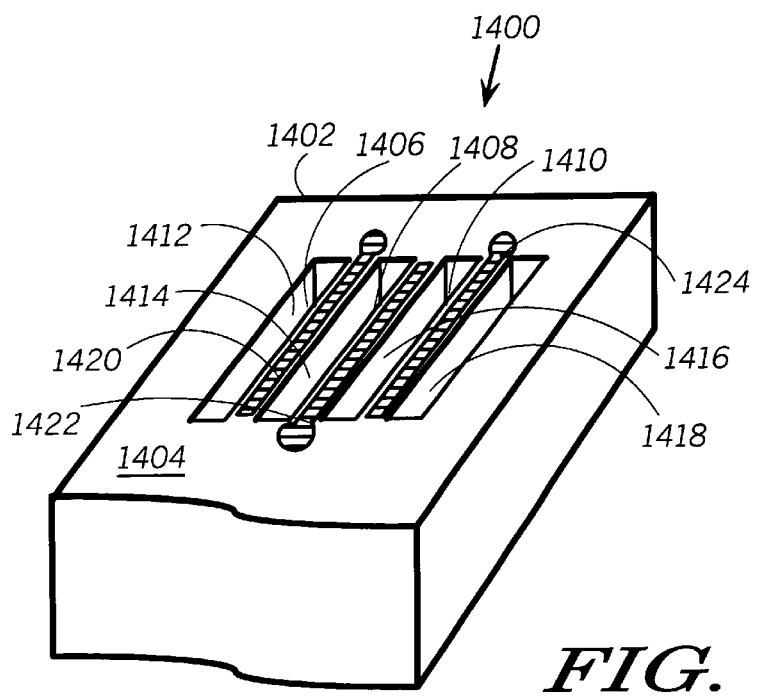
FIG. 14 is a fragmentary perspective view of a three plate electromechanical resonator according to an embodiment of the invention.

FIG. 14 is a fragmentary perspective view of a three plate electromechanical resonator 1400 according to an embodiment of the invention. The three plate resonator 1400 is fabricated in a major surface 1404 of a die 1402.

A first vibratable plate 1406 is located between a first trench 1412, and a second trench 1414, a second plate 1408 is located between the second trench 1414 and a third trench 1416, and a third vibratable plate 1410 is located between the third trench 1416 and a fourth trench 1418. The three plates 1406, 1408, 1410 are parallel. The second plate 1408 is not meant to vibrate.

A first conductive pathway 1420, a second conductive pathway 1422, and a third conductive pathway 1424 extend from the die major surface 1404 along the length of top edges of the first 1408, second 1410 and third 1410 plates respectively. The second conductive pathway 1422 serves as a fixed electrode for establishing attractive electric forces between the second plate 1408 and the first 1406 and third 1410 vibratable plates.

One way of driving the three plate resonator 1400 is to apply a bias $V_{B1}$ to the first 1420 and third 1424 conductive pathways, and to apply a signal of the form $V_{B2}-V_O^*Sin(\omega t)$, where $|V_{B1}-V_{B2}| \geq V_O$ to the second conductive pathway 1422. By applying such a bias and signal, the first 1406 and third 1410 vibratable plates are subjected to a periodic electrical attractive force toward the second plate. The first 1406 and third 1410 vibratable plates will be driven to vibrate in the lowest order mode available to a plate that is clamped along three edges and free on a fourth. The first 1406 and third 1410 vibratable plates vibrate in phase synchronism. Furthermore, the first 1406 and third 1410 vibratable plates mirror each other while vibrating. Periodic stresses at the edges of the first 1406, and third 1410 vibratable plates tend to destructively interfere with each other within the die, thereby reducing the loss of vibrational energy from the plates 1406, 1410 into the die 1402.

In order to increase the degree of destructive interference, the first 1406 and third 1410 vibratable plates are preferably spaced apart by less than one-half of a wavelength associated with propagation of acoustic waves in the die 1402 at the frequency at which the plates 1406, 1410 vibrate. More preferably the first 1406 and third 1410 vibratable plates are spaced apart by less than one-quarter the aforementioned wavelength, and even more preferably by less than one-tenth the aforementioned wavelength.

Figure 15:
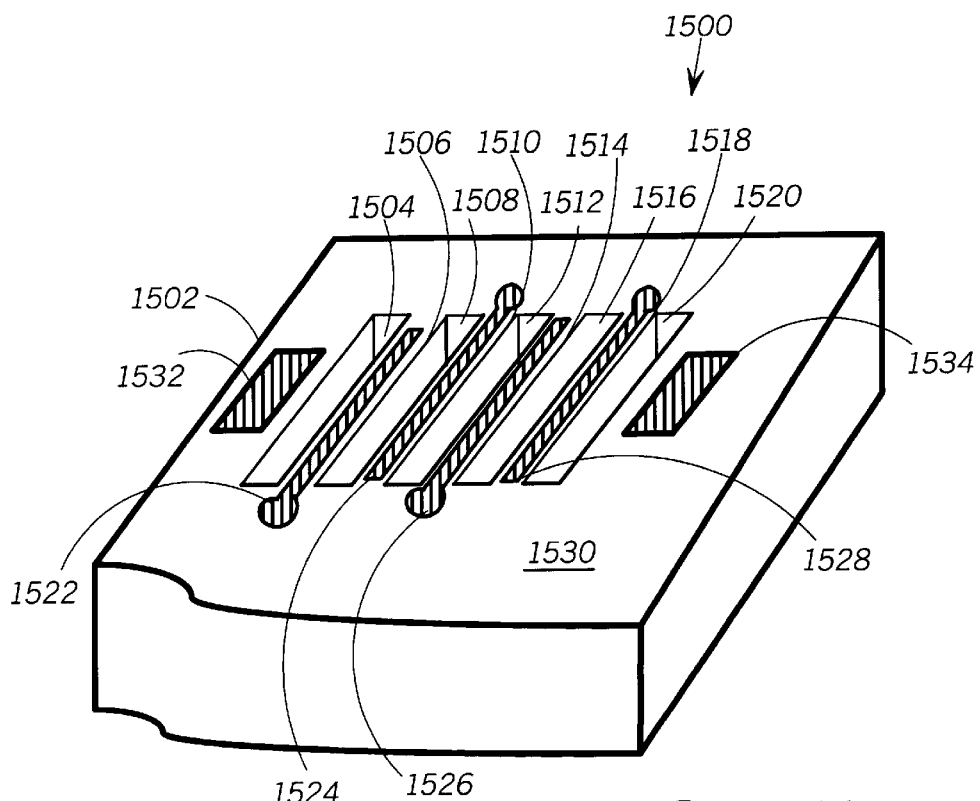
FIG. 15 is a fragmentary perspective view of a first four plate electromechanical resonator according to an embodiment of the invention.

FIG. 15 is a fragmentary perspective view of a first four plate electromechanical resonator 1500 according to an embodiment of the invention. The first four plate resonator 1500 is fabricated at a major surface 1530 of a die 1502. The resonator 1500 comprises an array of vibratable plates that includes, a first vibratable plate 1506 that is located between a first trench 1504 and a second trench 1508, a second vibratable plate 1510 that is located between the second trench 1508 and a third trench 1512, a third vibratable plate 1514 that is located between the third trench 1512, and a fourth trench 1516, and a fourth vibratable plate 1518 that is located between the fourth trench 1516 and a fifth trench 1520. A first fixed electrode 1532 is located adjacent the first trench 1504 opposite the first vibratable plate 1506. A second fixed electrode 1534 is located adjacent the fifth trench 1520 opposite the fourth vibratable plate 1518.

First 1522, second 1524, third 1526, and fourth 1528 conductive pathways extend from the die major surface 1530 along top edges of the first 1506, second 1510, third 1514, and fourth 1518 vibratable plates respectively. Portions of the four conductive pathways 1522, 1524, 1526, 1528 that overlie the vibratable plates 1506, 1510, 1514, 1518 serve as electrodes for establishing attractive electric forces for driving the vibratable plates 1506, 1510, 1514, 1518 to vibrate.

Preferably the first four plate resonator 1500 is driven by applying a sequence of signals in which each signal is repeatedly applied to two adjacent (consecutive) electrodes. More preferably the sequence of signals, is periodic, with a period of four. For example a first signal of the form $V_{B1}+V_O*\text{Sin}(\omega t)$ is applied to the first fixed electrode 1532, and the first conductive pathway 1522. A bias $V_{B2}$ is applied to second and third conductive pathways 1524, 1526. The signals and biases applied to the first fixed electrode 1532 and the first three conductive pathways 1522, 1524, 1526 constitute one period of a periodic sequence of signals. The periodic sequence continues with the fourth conductive pathway 1528, and the second fixed electrode 1534 to which the first signal of the form $V_{B1}+V_O*\text{Sin}(\omega t)$ is applied. Such a preferred periodic sequence of signals, in which each signal or bias is repeated on two adjacent electrodes, can be applied to resonators that have a greater number of vibratable plates than shown in FIG. 15.

One may also obtain a sequence of signals that is suitable for driving a resonator that includes an even number of vibratable plates arranged in an array, and two fixed electrodes at two ends of the array by extracting a sub-sequence (e.g., $[V_{S1}, V_{B1}, V_{B1}, V_{S1}, V_{S1}, V_{B1}]$) of length N+2 where N is the number of vibratable plates, from a hypothetical longer periodic sequence in which each signal appears repeated twice consecutively, and the pattern of signals repeats every four elements (e.g., $[V_{S1}, V_{S1}, V_{B1}, V_{B1}, V_{S1}, V_{S1}, V_{B1}, V_{B1}]$). The extracted sub-sequence will then include a sub-sequence (e.g., $[V_{B1}, V_{B1}, V_{S1}, V_{S1}]$) in which each signal is repeated twice consecutively. Preferably, the first and last signals of the extracted subsequence, i.e. the signals applied to the fixed electrodes, are not the same as the signals immediately adjacent to them in the extracted sequence.

Resonators that include more than two vibratable plates can be used to obtain increased bandwidth frequency response, for applications in which this is desired. In such cases small differences in the dimensions of the vibratable plates lead to differences in the center frequencies that characterizes their vibration. Multiple narrow bands associated with the vibrations of the plates combine to yield an overall resonator frequency response that is broader than the frequency response of individual vibratable plates.

Alternatively, the first four plate resonator 1500 may be operated by applying a first bias $V_{B1}$ to the first conductive pathway 1522 and the first fixed electrode 1532, applying a second bias $V_{B3}$ to the third conductive pathway 1526, applying a first signal of the form $V_{B2}+V_O*\text{Sin}(\omega t)$ where $V_{B1}\overset{\geq}{=}V_{B2}-V_O$ and $V_{B2}\overset{\geq}{=}V_{B3}-V_O$ to the second conductive pathway 1524, and applying a second signal of the form $V_{B4}+V_O*\text{Sin}(\omega t)$, where $V_{B4}\overset{-}{=}V_{B3}\overset{>}{=}V_O$, to the fourth conductive pathway 1528, and the second fixed electrode 1534. Preferably, $V_{B4}-V_{B3}=V_{B3}-V_{B2}=V_{B2}-V_{B1}$. Such signals and biases will result in a attractive periodically modulated attractive forces between the members of each pair of adjacent vibratable plates.

The vibrations of the vibratable plates in each pair of adjacent vibratable plates will be one-half a period out of phase. Therefore the periodic stress that occurs at the edges of the two adjacent vibratable plates, due to their respective vibrations tend to cancel each other by destructive interference, so that the loss of acoustic energy from the vibratable plates into the die 1530 is reduced.

Although four vibratable plates 1506, 1510, 1514 1518 are shown in FIG. 15, an array that has a multiple of four vibratable plates may be used. If a multiple of four vibratable plates is used a sequence of signals used in the first four vibratable plates (e.g., the sequence described above) is preferably applied to successive groups of four plates. More preferably the sequence of signals is selected so that each pair of vibratable plates that include a first plate from one group of four and a second vibratable plate from an adjacent group of four (for example the fourth and fifth plates of an eight plate resonator) will be one-half a vibration period out of phase (i.e. the plates will mirror each other's motion). The exemplary set of biases and signals described above would meet the foregoing preference, if applied to successive sets of four plates in a resonator that included a multiple of four plates.

Figure 16:
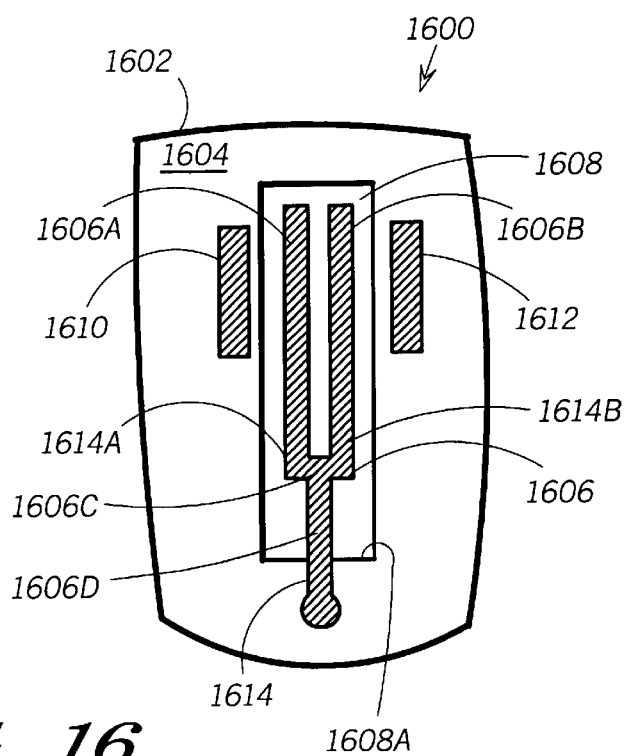
FIG. 16 is a fragmentary plan view of a seventh two plate electromechanical resonator according to an embodiment of the invention.

FIG. 16 is a fragmentary plan view of a seventh two plate electromechanical resonator 1600 according to an embodiment of the invention. The seventh resonator 1600 is fabricated at a major surface 1604 of a semiconductor die 1602.

The seventh resonator 1600 comprises a tuning fork shaped member 1606 that is located in a recess 1608 in the major surface 1604 of the die 1602. The tuning fork shaped member 1606 comprises a first vibratable plate 1606A, and a second vibratable plate 1606B that is spaced from, and parallel to, the first vibratable plate 1606A. The first and second vibratable plates 1606A, 1606B are connected to a coupling member 1606C, that is also part of the tuning fork shaped member 1606. End edges of the vibratable plates 1606A, 1606B opposite the coupling member 1606C are free, and therefore can not emit vibrational energy into the die 1602. The coupling member 1606C receives vibrational energy from the first and second vibratable plates 1606A, 1606B and destructively combines it so as to reduce the amount of acoustic energy that is radiated from the vibratable plates 1606A, 1606B into the die 1602. In other words, destructive interference of acoustic signals emanating from the two vibratable plates 1606A, 1606B takes place in the coupling member 1606C. As shown the coupling member 1606C takes the form of rectangular plate. Alternatively other coupling members having other shapes are used. The two vibratable plates 1606A, 1606B are connected to two ends of the coupling member 1606C.

Abiding by the above stated relation between the height, H and the length, L of vibratable plates 1606A, 1606B leads to a relatively short length, which tends to increase the strain at the junctures between the vibratable plates 1606A, 1606B and the coupling member 1606C. This, in turn, tends to increase the potential for acoustic energy leaked into the coupling member 1606C. However due to destructive interference this leakage is minimized. Thus, the above stated preferred relation can be abided in order to obtain resonators with improved designs from a manufacturability stand point, without incurring increased acoustic energy leakage and the associated degradation of resonator Q.

An electrical crossover 1606D is connected between the coupling member 1606C and a peripheral wall 1608A of the recess 1608. The electrical crossover 1606D takes the form of a plate that extends down to the bottom of the recess 1608, where it connects to the main body of the die 1602.

Alternatively, the electrical crossover 1606D takes the form of an air bridge. The electrical crossover 1606D is connected to the coupling member 1606C at a point that is equally spaced from the two vibratable plates 1606A, 1606B, so that the acoustic phase length (within the coupling member) between the first vibratable plate 1606A and the electrical crossover 1606D is equal to the acoustic phase length between the second vibratable plate 1606B and the electrical crossover 1606D. The equal phase lengths taken together with the fact that the two vibratable plates 1606A, 1606B are driven to vibrate in such a manner that there vibrations mirror each other, results in two equal but opposite phase acoustic signal from the two vibratable plates 1606A, 1606B appearing at the junction of the coupling member 1606C, and the electrical crossover 1606D. Destructive interference occurs at the junction so as to reduce the magnitude of acoustic energy that is leaked across the electrical crossover 1606D into the main body of the die 1602. A branched conductive pathway 1614 extends from the die major surface 1604 across the electrical crossover 1606D to the coupling member 1606C. A first branch 1614A of the branched conductive pathway 1606D extends along the coupling member 1606C to the first vibratable plate 1606A, and along the length of the top edge of the first vibratable plate 1606A. A second branch 1614B of the branched conductive pathway 1614 extends along the coupling member 1606C to the second vibratable plate 1606B, and along the length of the top edge of second vibratable plate 1606B. The segment of the branched conductive pathway 1614 that extends from the die major surface 1604 across the electrical crossover 1606D to the coupling member 1606C, may also be termed a branch.

A first fixed electrode 1610 is located on the die major surface 1604 facing the first vibratable plate 1606A near its free end. A second fixed electrode 1612 is located on the opposite side of the recess 1608 from the first fixed electrode 1610 facing the second vibratable plate 1606B near its free end. The first and second fixed electrodes 1610, 1612 are used along with the branched conductive pathway 1614 to drive the first and second vibratable plates 1606A, 1606B to vibrate. The mode of vibration in which the vibratable plates 1606A, 1606B vibrate includes an antinode near the intersection of the top and free end edges of the vibratable plates 1606A, 1606B.

One way of driving the seventh resonator 1600 is bias the first and second fixed electrodes 1610, 1612 to a first voltage $V_{B1}$ and to couple a signal of the form $V_{B2}+V_O*\mathrm{Sin}(\omega t)$ where $|V_{B1}-V_{B2}| \geq V_O$ to the branched conductive pathway 1614. Alternatively, the preceding signal is coupled to the first and second fixed electrodes 1610, 1612, and the branched conductive pathway 1614 is biased to $V_{B1}$. Either way, the vibratable plates 1606, 1608 will be driven to vibrate symmetrically i.e., mirror each other as they vibrate.

The tuning fork shaped member 1606 is preferably formed by patternwise deep anisotropic etching of the recess 1608.

Figure 17:
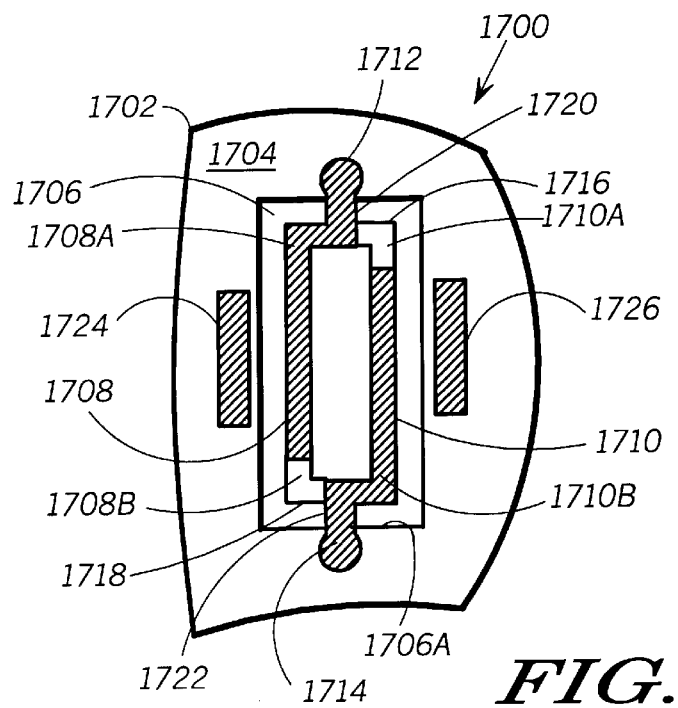
FIG. 17 is a fragmentary plan view of an eighth two plate electromechanical resonator according to an embodiment of the invention.

FIG. 17 is a fragmentary plan view of an eighth two plate electromechanical resonator 1700 according to an embodiment of the invention. The eighth resonator 1700 is fabricated at a major surface 1704 of a semiconductor die 1702.

The eighth resonator 1700 comprises a first vibratable plate 1708, and a second vibratable plate 1710 located in a recess 1706 in the die major surface 1704. A first coupling member 1716 is connected to a first end 1708A of the first vibratable plate 1708, and to a first end 1710A of the second vibratable plate 1710. A second coupling member 1718 is connected to a second end 1708B of the first vibratable plate 1708, and to a second end 1710B of the second vibratable plate 1710. A first electrical crossover 1720 is connected to a peripheral wall 1706A of the recess 1706 and is connected to the first coupling member 1716 at a point midway between the first vibratable plate 1708 and the second vibratable plate 1710. A second electrical crossover 1722 is connected to the peripheral wall 1706A of the recess 1706 and is connected to the second coupling member 1718 at a point midway between the first vibratable plate 1708, and the second vibratable plate 1710. Acoustic energy that is coupled into the first 1716, and second 1718 coupling members from the first 1708 and second 1710 vibratable plates will destructively interfere at junctures of the first 1716 and second 1718 coupling members with the first 1720, and 1722 electrical crossovers thereby reducing the amount of acoustic energy dissipated through the electrical crossovers 1720, 1722 into the die 1702.

A first conductive pathway 1712 extends from the die major surface 1712, over the first electrical crossover 1720 to the first coupling member 1716, along the first coupling member 1716 to the first end 1708A of the first vibratable plate 1708, and along the length of the top edge of the first vibratable plate 1708. A second conductive pathway 1714 extends from the die major surface 1712, over the second electrical crossover 1722 to the second coupling member 1718, along the second coupling member 1718 to the second end 1710B of the second vibratable plate 1710, and along the length of the top edge of the second vibratable plate 1710.

A first fixed electrode 1724 is located on the die major surface proximate to the first vibratable plate 1708, equidistant from the first 1708A and second 1708B ends of the first vibratable plate. A second fixed electrode 1726 is located on an opposite side of the recess 1706 from the first fixed electrode 1724, proximate the second vibratable plate 1710 equidistant from the first 1710A and second 1710B ends of the second vibratable plate 1710.

The first and second vibratable plates 1708, 1710 vibrate in the mode illustrated in FIG. 4.

One way to drive the eighth resonator 1700 is to bias second fixed electrode 1726 and the first conductive pathway 1712 to $V_{B1}$ and to a couple a signal of the form $V_{B2}+V_O*\mathrm{Sin}(\omega t)$ where $|V_{B1}-V_{B2}| \geq V_O$ to the first fixed electrode 1724 and the second conductive pathway 1714.

A second way to drive the eighth resonator 1700 is to bias the first and second fixed electrodes 1724 1726 to $V_{B1}$ and to couple a signal of the form $V_{B2}+V_O*\mathrm{Sin}(\omega t)$ where $|V_{B1}-V_{B2}| \geq V_O$ to the first and second conductive pathways 1712, 1714.

Figure 18:
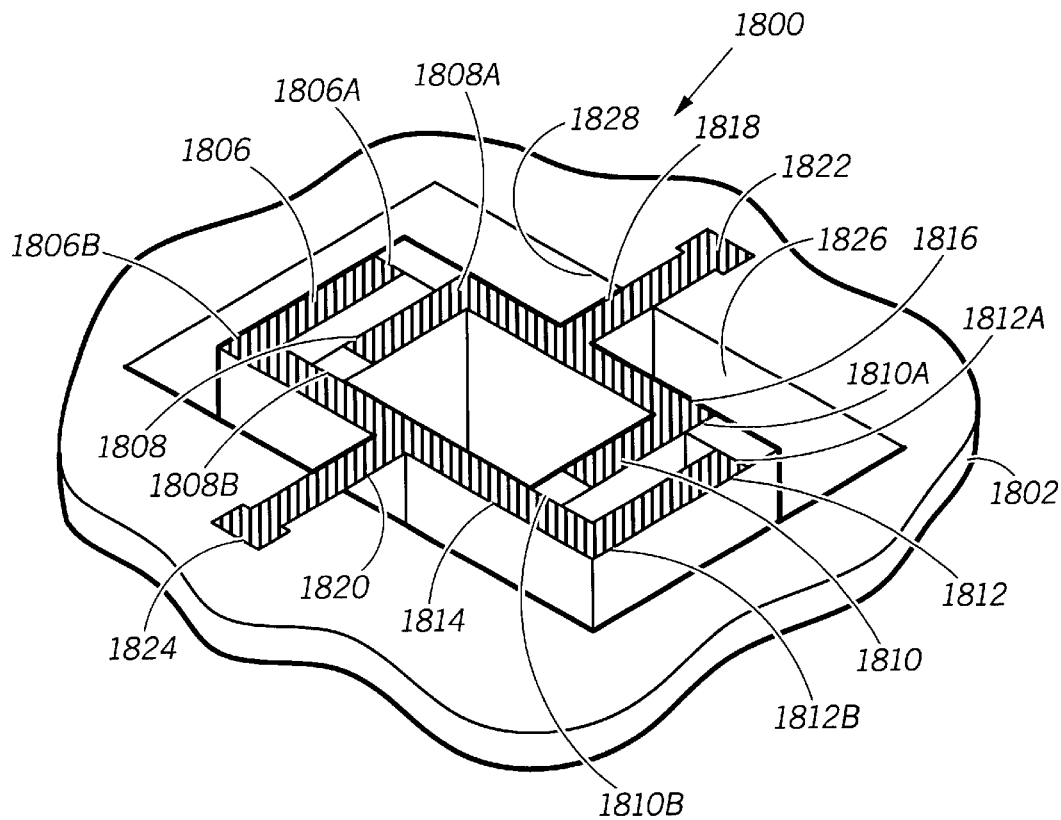
FIG. 18 is a fragmentary perspective view of a second four plate electromechanical resonator according to an embodiment of the invention.

FIG. 18 is a fragmentary perspective view of a second four plate electromechanical resonator 1800 according to an embodiment of the invention.

The second four plate resonator 1800 is fabricated at a first major surface 1804 of a die 1802. The second four plate resonator 1800 comprises a first vibratable plate 1806, a second vibratable plate 1808, a third vibratable plate 1810, and a fourth vibratable plate 1812. The vibratable plates 1806, 1808, 1810, 1812 are located in a recess 1826 in the first major surface 1804. Also located in the recess 1826 are a first coupling plate 1814, and a second coupling plate 1816, as well as a first electrical crossover plate 1818 and a second electrical crossover plate 1820. The four vibratable plates 1806, 1808, 1810, 1812 are arranged parallel to each other. The first 1806, and second 1808 vibratable plates are located close to each other preferably less than one-tenth of a wavelength that characterizes an acoustic signal propagating in the die 1802 at a frequency at which the vibratable plates 1806, 1808, 1810, 1812 are driven to vibrate. The third 1810 and fourth 1812 vibratable plates are also preferably spaced by less than one-tenth of the aforementioned wavelength. The first 1806, and third 1810 vibratable plates are preferably spaced apart by about ½ of the aforementioned wavelength. The second 1808 and fourth 1812 vibratable plates are also preferably spaced apart by about ½ of the aforementioned wavelength.

A first end edge 1806A of the first vibratable plate 1806, a first end edge 1808A of the second vibratable plate 1808, a first edge end 1810A of the third vibratable plate 1810 and a first end edge 1812A of the fourth vibratable plate 1812 are connected to the first coupling plate 1814. A second end edge 1806B of the first vibratable plate 1806, a second end edge 1808B of the second vibratable plate 1808, a second edge end 1810B of the third vibratable plate 1810 and a second end edge 1812B of the fourth vibratable plate 1812 are connected to the second coupling plate 1816.

In operation the first 1806 and third 1808 vibratable plates are driven to vibrate in phase with each other, and the second 1808 and fourth 1812 vibratable plates are driven to vibrate in phase with each other. In operation, the first 1806, and second plates vibrate one-half a vibration period out of phase (e.g. when one is bowed to the left the other is bowed to the right). It follows from the preceding that the third 1810, and fourth 1812 vibratable plates vibrate one-half a vibration period out of phase.

Because the first 1806 and the second 1808 vibratable plates are closely spaced relative to the aforementioned wavelength (preferably by less than one-tenth of the wavelength) and because of the fact that they vibrate one-half a vibration period out of phase, the amount of acoustic energy that is leaked from their edges (including bottom edges, not seen in FIG. 18) 1804 is reduced, by destructive interference. Acoustic energy leakage from the third 1810, and fourth 1812 vibratable plates is reduced in the same manner.

Because the first 1806 and third 1810 vibratable plates vibrate in phase with each other and are spaced apart by about ½ the aforementioned wavelength, destructive interference occurs along a line that includes the shortest path between the two plates 1806, 1808 (i.e., in the two directions corresponding to the vibratable plate major surface normal vectors). The destructive interference along the aforementioned line tends to make the acoustic radiation pattern associated with the two plates more directional, and reduces the overall loss of acoustic energy from the two plates 1806, 1810, by leakage into the die 1802. The same effect reduces the leakage from the second 1808 and fourth 1810 vibratable plates.

A first electrical crossover 1818 connects a peripheral wall 1828 of the recess 1826 to the first coupling plate 1814. A second electrical crossover connects the peripheral wall 1828 on the opposite side of the recess 1826 to the second coupling plate 1816.

The first 1818 and second 1820 electrical crossovers connect to the first 1814 and second 1816 coupling plates respectively at points that are equidistant from the first 1806 and fourth 1812 vibratable plates and also equidistant from the second 1808, and third 1810 vibratable plates.

Accordingly, at the junction of the first 1818 and second 1820 electrical crossovers with the first 1814, and second 1816 coupling plates destructive interference will occur between wave energy emanating from the first 1806 and fourth 1812 plates and between wave energy emanating from the second 1808 and third 1810 plates. The destructive interference reduces the acoustic power coupled across the first 1818 and second 1820 electrical cross over to the die 1802. The coupling plates 1814, 1816 are preferably thicker than the vibratable plates 1806, 1808, 1810, 1812 so as to reduce vibration of the coupling plates 1814, 1816.

The above describe effects reduce loss of acoustic energy from the vibrating plates 1806, 1808, 1810, 1810 and increase the Q-factor of the second four plate resonator 1800.

The resonator 1800 further comprises a first branched conductive pathway 1822 that extends from the die major surface 1804 across the first electrical crossover 1818 to the first coupling plate 1814. The first conductive pathway 1822 includes a first branch that extends from the junction of the first electrical cross over 1818 and the first coupling plate 1814 along the length of the first coupling plate 1814 to the junction of first coupling plate 1814 and the second vibratable plate 1808, and along the length of the second vibratable plate 1808. A second branch of the first conductive pathway 1822 extends from the junction of the first electrical cross over 1818 and the first coupling plate 1814 along the length of the first coupling plate 1814 to the junction of the first coupling plate 1814 and the third vibratable plate 1810, and along the length of the third vibratable plate 1810. The portion of the first branched conductive pathway 1822 that extends from the die major surface 1804 across the first electrical crossover 1818 to the first coupling plate 1814, can also be termed a branch.

A second branched conductive pathway 1824 extends from the die major surface 1824 across the second electrical crossover 1820 to the second coupling plate 1816. A first branch of the second conductive pathway 1824 extends from the junction of the second electrical crossover 1820 and the second coupling plate 1816 along the second coupling plate 1816 to the junction of the second coupling plate 1816 and the first vibratable plate 1806 and along the length of the first vibratable plate 1806. A second branch of the second conductive pathway 1824 extends from the junction of the second electrical crossover 1820 and the second coupling plate 1816 along the second coupling plate 1816 to the junction of the second coupling plate 1816 and the fourth vibratable plate 1812 and along the length of the fourth vibratable plate 1812.

Portions of the first 1822 and second 1824 conductive pathways on the four vibratable plates 1806, 1808, 1810, 1812 serve as electrodes for establishing electrostatic forces for driving vibration of the vibratable plates 1806, 1808, 1810, 1812.

A preferred way of operating the second four plate resonator 1800 is to bias the first conductive pathway 1822 to $V_{B1}$ and to apply a signal of the form $V_{B1}+V_O*\operatorname{Sin}(\omega t)$ where $0 \leq V_{B1} - V_O$ to the second conductive pathway 1824.

Figure 19:
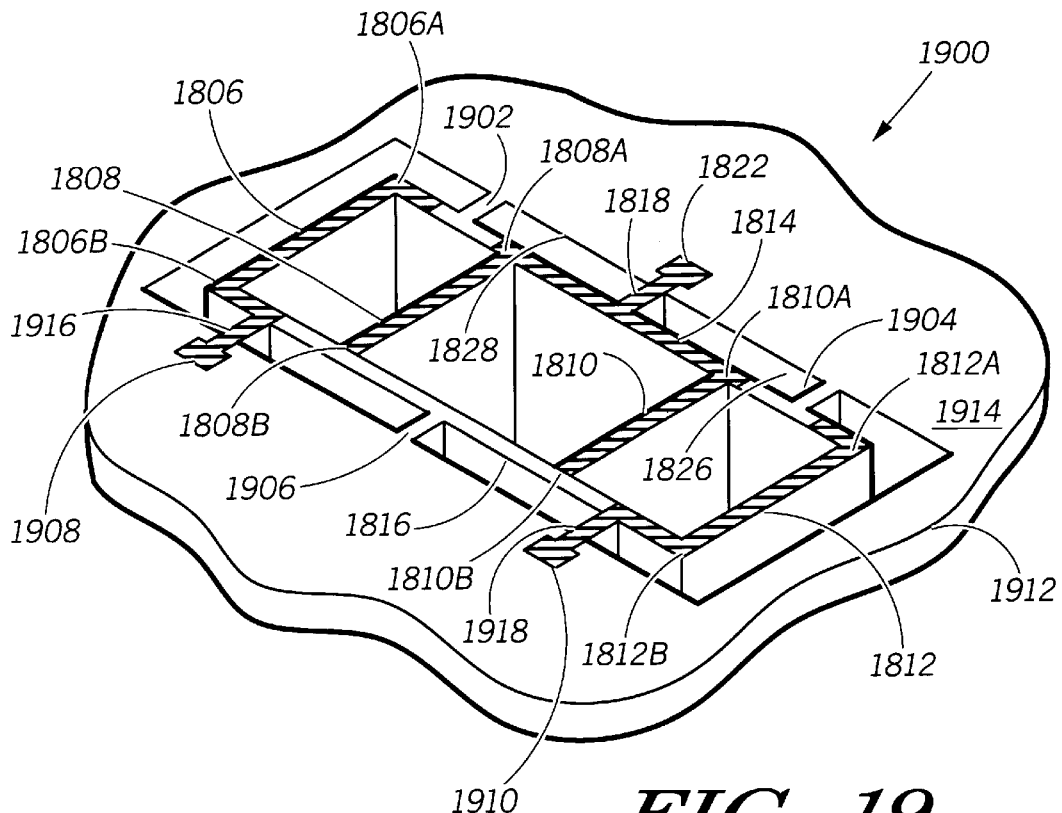
FIG. 19 is a fragmentary perspective view of a third four plate electromechanical resonator according to an embodiment of the invention.

FIG. 19 is a fragmentary perspective view of a third four plate electromechanical resonator 1900 according to an embodiment of the invention. The third four plate resonator 1900 is fabricated in a major surface 1914 of a die 1912. The third four plate resonator 1900 has numerous parts, as indicated by common reference numerals, in common with the second four plate resonator 1800 shown in FIG. 18. The common parts have been described above with reference to FIG. 18. A description will now be given of the aspects of the third four plate resonator 1900 not found in the second four plate resonator 1800.

A first stay plate 1902 extends perpendicularly from the first coupling plate 1814, from a point equidistant from the first 1806 and second 1808 vibratable plates to the peripheral wall 1828. A second stay plate 1904 extends perpendicularly from the first coupling plate 1814 from a point that is equidistant from the third 1810 and fourth 1812 vibratable plates to the peripheral wall. A third stay plate 1906 is located in the position that is occupied by the second electrical crossover 1820 (FIG. 18) in the second four plate resonator. In the third four plate resonator 1900, a third electrical crossover 1916 extends perpendicularly from the second coupling plate 1816, from a point that is equidistant from the first 1806 and second 1808 vibratable plates, to the peripheral wall 1828. A fourth electrical crossover 1918 extends perpendicularly from the second coupling plate 1816, from a point that is equidistant from the third 1810 and fourth 1812 vibratable plates to the peripheral wall 1828. Acoustic signals from the first 1806, and second 1808 vibratable plates will destructively interfere at the juncture of the second coupling plate 1816 and the third electrical crossover 1916, thereby reducing the acoustic energy coupled out of the resonator through the third electrical crossover 1916. Similarly, acoustic signals from the third 1810, and fourth 1812 vibratable plates will destructively interfere at the juncture of the second coupling plate 1816 and the fourth electrical crossover 1918.

The second conductive pathway 1824, and second electrical crossover 1820 of the second four plate resonator 1800, are not used in the third four plate resonator 1900. In the third four plate resonator 1900, a third conductive pathway 1908 extends from the die major surface 1914 over the third electrical crossover 1916 to the second coupling plate 1816, to the first vibratable plate 1806, and along the length of the first vibratable plate 1806. A fourth conductive pathway 1910 extends from the die major surface 1914 over the fourth electrical crossover 1918 to the second coupling plate 1816, along the second coupling plate 1816 to the fourth vibratable plate 1812, and along the length of the fourth vibratable plate 1812. Portions of the first 1822, third 1908, and fourth 1910 conductive pathways that overlie the vibratable plates 1806, 1808, 1810, 1812 serve as electrodes for establishing attractive electrostatic forces for driving the resonator 1900.

The operation of the third four plate resonator 1900 is similar to the operation of the second four plate resonator. One way of operating the third four plate resonator 1900 is to bias the first conductive pathway 1822 to $V_{B1}$ and to apply a signal of the form $V_{B1}+V_O*\text{Sin}(\omega t)$ where $|V_{B1}-V_{B2}| \geq V_O$ to the third 1908 and fourth 1910 conductive pathways.

Figure 20:
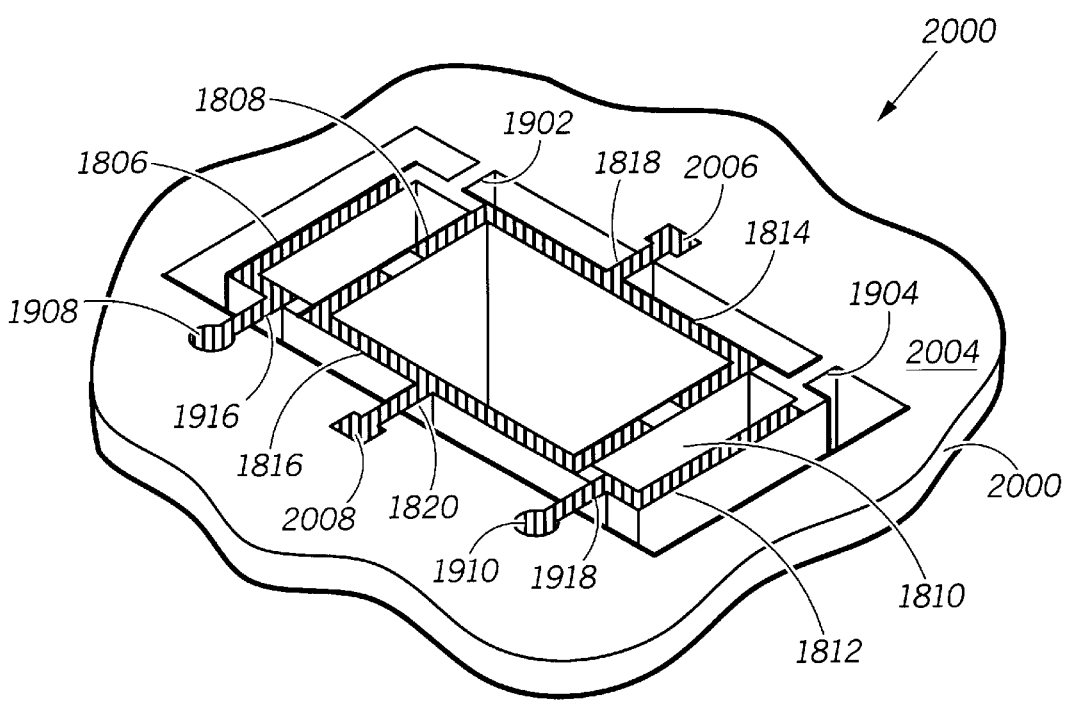
FIG. 20 is a fragmentary perspective view of a fourth four plate electromechanical resonator according to an embodiment of the invention.

FIG. 20 is a fragmentary perspective view of a fourth four plate electromechanical resonator 2000 according to an embodiment of the invention. The fourth four plate electromechanical resonator 2000 is fabricated at a major surface 2004 of a die 2002. The fourth four plate resonator 2000 has numerous parts, as indicated by common reference numerals, in common with the second 1800 and third 1900 four plate resonators shown in FIG. 18 and FIG. 19 respectively. The common parts have been described above with reference to FIGS. 18 and 19. A description will now be given of the aspects of the fourth four plate resonator 2000 not found in the second 1800 or third 1900 four plate resonators.

In contrast to the second 1800, and third 1900 four plate resonators in which the vibratable plates 1806, 1808, 1810, 1812 are drive to vibrate in the fundamental mode that is consistent with their boundary conditions, in the fourth four plate resonator 2000, the vibratable plates 1806, 1808, 1810, 1812 are driven to vibrate in the flexural overtone mode depicted in FIG. 8. The flexural overtone mode is accessed by properly select a driving frequency in view of the dimensions of the vibratable plates 1806, 1808, 1810, 1812, providing the conductive pathways described below, and by applying proper signals and biases to the conductive pathways as described below. The phase relationships of the vibrations of the four plates that were described above with reference to the second four plate resonator 1800 hold for the fourth four plate resonator 2000.

In addition to the third 1908 and fourth 1910 conductive pathways that are described above in connection with the third four plate resonator 1900, the fourth four plate resonator 2000 includes a first conductive pathway 2006, and a second conductive pathway 2008.

The first conductive pathway 2006 includes a first branch that extends from the die major surface 2004 across the first electrical crossover 1818 to the first coupling plate 1814, a second branch that extends from the juncture of the first electrical crossover 1818 and the first coupling plate 1814, along the first coupling plate 1814 to the juncture of the first coupling plate 1814 and the second vibratable plate 1808, and along the length of the top edge of the second vibratable plate 1808 toward but not to a midpoint of the second vibratable plate 1808, and a third branch that extends from the juncture of the first electrical crossover 1818 and the first coupling plate 1814, along the first coupling plate 1814 to the juncture of the first coupling plate 1814 and the third vibratable plate 1810, and along the top edge of the third vibratable plate 1810 toward but not to a midpoint of the third vibratable plate 1810.

Similarly, the second conductive pathway 2008 includes a first branch that extends from the die major surface 2004 across the second electrical crossover 1820 to the second coupling plate 1816, a second branch that extends from the juncture of the second electrical crossover 1820 and the second coupling plate 1816, along the second coupling plate 1816 to the juncture of the second coupling plate 1816 and the second vibratable plate 1808, and along the length of the top edge of the second vibratable plate 1808 toward but not to a midpoint of the second vibratable plate 1808, and a third branch that extends from the juncture of the second electrical crossover 1820 and the second coupling plate 1816, along the second coupling plate 1816 to the juncture of the second coupling plate 1816 and the third vibratable plate 1810, and along the top edge of the third vibratable plate 1810 toward but not to a midpoint of the third vibratable plate 1810.

Ends of branches of the first 2006 and second 2008 conductive pathways that lie on the second 1808 and third 1810 vibratable plates are isolated from each other by at least one reverse biased junction. Semiconductor junction form between areas near the midpoints of the second 1808 and third 1806 vibratable plates that have the background doping of the die 2002, and the conductive pathways 2006, 2008.

One way of driving the fourth four plate resonator 2000 is to bias the third 1908 and fourth 1910 conductive pathways to $V_{B1}$, and to apply a signal of the form $V_{B2}+V_O*\text{Sin}(\omega t)$ where $|V_{B1}-V_{B2}| \geq V_O$ to the first conductive pathway 1822. The second conductive pathway can then be used as an output of the resonator 2000.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. An electromechanical resonator comprising:
   a semiconductor die including:

a first vibratable plate that is capable of resonant vibration at a frequency that corresponds to a wavelength of acoustic waves in the die; and a second vibratable plate that is capable of resonant vibration at the frequency, and is spaced from the first vibratable plate by less than about one-half the wavelength.

2. The electromechanical resonator according to claim 1 wherein:

the first vibratable plate is spaced from the second vibratable plate by less than about one-quarter the wavelength.

3. The electromechanical resonator according to claim 1 wherein:

the second vibratable plate is spaced from the first vibratable plate by less than about one-tenth of the wavelength.

4. The electromechanical resonator according to claim 1 wherein:

the first vibratable plate includes a first electrode that is adapted for coupling to an electrical circuit for establishing an electric field that emanates from the first vibratable plate whereby an electric force associated with the electric field drives the resonant vibration of the first vibratable plate.

5. The electromechanical resonator according to claim 4 wherein:

the second vibratable plate comprises a second electrode for terminating the electric field;

whereby, the electric force drives the resonant vibration of the first vibratable and the second vibratable plate in phase synchronism.

6. The electromechanical resonator according to claim 5 wherein: the second vibratable electrode is adapted for coupling to a biasing circuit.

7. The electromechanical resonator according to claim 1 wherein:

the semiconductor die has a die major surface characterized by a die surface normal; and the first vibratable plate comprises:
a first vibratable plate major surface characterized by a first vibratable plate major surface normal that is substantially perpendicular to the die surface normal;
a first side edge;
a second side edge;
a bottom edge; and
a top edge.

8. The electromechanical resonator according to claim 7 comprising:

a number N, where N is a multiple of four, of vibratable plates arranged in an array, the vibratable plates each including:
one of a sequence of N electrodes; wherein
the sequence of N electrodes is adapted for coupling to a sequence of signals that includes a repeating sequence of four driving signals.

9. The electromechanical resonator according to claim 7 further comprising:

a number N, where N is a multiple of two, of vibratable plates arranged in an array, the vibratable plates each including one of a sequence of N electrodes;
a first fixed electrode on a first side of the array;
a second fixed electrode on a second side of the array;
wherein the sequence of N electrodes, the first fixed electrode, and the second fixed electrode are adopted for coupling to a sequence of N+2 signals that includes a subsequence of N signals in which signals appear repeated twice consecutively.

10. The electromechanical resonator according to claim 7 wherein:

the second vibratable plate comprises:
a second vibratable plate major surface characterized by a second vibratable plate major surface normal that is substantially perpendicular to the die surface normal;
a first side edge;
a second side edge;
a bottom edge; and
a top edge.

11. The electromechanical resonator according to claim 10 wherein:

the first vibratable plate major surface normal is substantially parallel to the second vibratable plate major surface normal.

12. The electromechanical resonator according to claim 10 wherein:

the first side edge, second side edge, and bottom edge of the first vibratable plate are connected to the die;
the top edge of the first vibratable plate is free;
the first side edge, second side edge, and bottom edge of the second vibratable plate are connected to the die;
the top edge of the second vibratable plate is free;
the first vibratable plate is characterized by a length L measured along the top edge of the first vibratable plate, and a height H measured along the first side edge of the first vibratable plate;
the second vibratable plate is characterized by the length L, and the height H; and the first and second vibratable plates vibrate in a mode characterized by:
a first number N of nodal lines that are substantially aligned with the height of the first and second vibratable plates; and
a second number M of nodal lines that are substantially aligned with the length of the first and second vibratable plates; and
the quantity:

$$\frac{N \cdot H}{(2 \cdot M - 1) \cdot L}$$

is at least about three.

13. The electromechanical resonator according to claim 10 wherein:

the first side edge, and bottom edge of the first vibratable plate are connected to the die;
the top edge and the second side edge of the first vibratable plate are free;
the first side edge, and bottom edge of the second vibratable plate are connected to the die;
the top edge and second side edge of the second vibratable plate are free;
the first vibratable plate is characterized by a length L measured along the top edge of the first vibratable plate, and a height H measured along the first side edge of the first vibratable plate;
the second vibratable plate is characterized by the length L, and the height H; and
the first and second vibratable plates vibrate in a mode characterized by:

a first number N of nodal lines that are substantially aligned with the height of the first and second vibratable plates; and a second number M of nodal lines that are substantially aligned with the length of the first and second vibratable plates; and the quantity:

$$\frac{(2 \cdot N - 1) \cdot H}{(2 \cdot M - 1) \cdot L}$$

is at least about three.

14. The electromechanical resonator according to claim 10 further comprising:

a first conductive pathway from the die major surface onto the first vibratable plate; and a second conductive pathway from the die major surface onto the second vibratable plate.

15. The electromechanical resonator according to claim 14 wherein:

the first and second vibratable plates are characterized by a height; and the first conductive pathways comprises a doped region that extends from the top edge of the first vibratable plate down through at least about ⅓ of the height of the first vibratable plate; and the second conductive pathway comprises a doped region that extends from the top edge of the second vibratable plate down through at least about ⅓ of the height of the second vibratable plate.

16. The electromechanical resonator according to claim 14 further comprising:

a third conductive pathway from the die major surface onto the first vibratable plate, wherein the first conductive pathway is isolated from the third conductive pathway.

17. The electromechanical resonator according to claim 14 further comprising:

a first fixed electrode located proximate the first vibratable plate.

18. The electromechanical resonator according to claim 17 wherein:

the first and second vibratable plates are characterized by a height;

the first fixed electrode comprises a doped region that extends down within the die from the die major surface by a distance equal to at least ⅓ of the height.

19. The electromechanical resonator according to claim 17 further comprising:

a trench that is located between the first fixed electrode and the first vibratable plate and includes:

a first isolation leg extending away from the first vibratable plate on a first side of the first fixed electrode; and a second isolation leg extending away from the first vibratable plate on a second side of the first fixed electrode.

20. The electromechanical resonator according to claim 17 wherein:

the first fixed electrode is located between the first vibratable plate and the second vibratable plate.

21. The electromechanical resonator according to claim 17 further comprising:

a second fixed electrode located proximate the second vibratable plate.

22. The electromechanical resonator according to claim 21 wherein:

the first vibratable plate and the second vibratable plate are located between first fixed electrode and the second fixed electrode.

23. The electromechanical resonator according to claim 17 wherein:

the first fixed electrode is located on a first side of the first vibratable plate; and a second fixed electrode is located proximate the first vibratable plate.

24. The electromechanical resonator according to claim 23 wherein:

the second fixed electrode is located on the first side of the first vibratable plate adjacent to the first fixed electrode.

25. The electromechanical resonator according to claim 24 further comprising:

a trench that is located between the first vibratable plate and the first and second fixed electrodes, and includes a first isolation leg that extends away from the first vibratable plate between the first and second fixed electrodes.

26. The electromechanical resonator according to claim 25 further comprising:

a second isolation leg proximate the first fixed electrode opposite the first isolation leg.

27. The electromechanical resonator according to claim 24 further comprising:

a third fixed electrode located on a first side of the second vibratable plate; and a fourth fixed electrode located on the first side of the second fixed electrode.

28. The electromechanical resonator according to claim 27 wherein:

the first vibratable plate and the second vibratable plate are located between the first fixed electrode and the third fixed electrode.

29. The electromechanical resonator according to claim 10 wherein:

the bottom edge of the first vibratable plate is connected to the semiconductor die; and the top edge of the first vibratable plate is free;

the bottom edge of the second vibratable plate is connected to the semiconductor die; and the top edge of the second vibratable plate is free.

30. The electromechanical resonator according to claim 29 wherein:

the first side edge of the first vibratable plate is connected to the semiconductor die;

the first side edge of the second vibratable plate is connected to the semiconductor die;

the second side edge of the first vibratable plate is free; and the second side edge of the second vibratable plate is free.

31. The electromechanical resonator according to claim 30 further comprising:

a fixed electrode located between the first vibratable plate and the second vibratable plate.

32. The electromechanical resonator according to claim 30 further comprising:

a first fixed electrode located on a first side of the first and second vibratable plates; and a second fixed electrode located on a second side of the first and second vibratable plates.

33. The electromechanical resonator according to claim 31 further comprising:
a third fixed electrode adjacent to the first fixed electrode on the first side of the first and second vibratable plates; and
a fourth fixed electrode adjacent to the second fixed electrode on the second side of the first and second vibratable plates.

34. The electromechanical resonator according to claim 29 further comprising:
a first coupling member for coupling to the first and second vibratable plates, and destructively combining acoustic energy emitted by the first and second vibrational plates.

35. The electromechanical resonator according to claim 34 wherein:
the first coupling member is coupled to the first side edge of the first vibratable plate and the first side edge of the second vibratable plate.

36. The electromechanical resonator according to claim 35 wherein:
the bottom edge of the first vibratable plate is connected to the die;
the top edge and the second side edge of the first vibratable plate are free;
the bottom edge of the second vibratable plate is connected to the die;
the top edge and second side edge of the second vibratable plate are free;
the first vibratable plate is characterized by a length L measured along the top edge of the first vibratable plate, and a height H measured along the first side edge of the first vibratable plate;
the second vibratable plate is characterized by the length L, and the height H; and
the first and second vibratable plates vibrate in a mode characterized by:
a first number N of nodal lines that are substantially aligned with the height of the first and second vibratable plates; and
a second number M of nodal lines that are substantially aligned with the length of the first and second vibratable plates; and
the quantity:

$$\frac{(2 \cdot N - 1) \cdot H}{(2 \cdot M - 1) \cdot L}$$

is at least about three.

37. The electromechanical resonator according to claim 35 wherein the first coupling member comprises:
a coupling plate.

38. The electromechanical resonator according to claim 35 further comprising:
a second coupling member that is coupled to the second side edge of the first vibratable plate and the second side edge of the second vibratable plate, for coupling the first and second vibratable plates and destructively combining acoustic energy emitted by the first and second vibrational plates.

39. The electromechanical resonator according to claim 38 wherein:
the bottom edge of the first vibratable plate is connected to the die;
the top edge of the first vibratable plate is free;
the bottom edge of the second vibratable plate is connected to the die;
the top edge of the second vibratable plate is free;
the first vibratable plate is characterized by a length L measured along the top edge of the first vibratable plate, and a height H measured along the first side edge of the first vibratable plate;
the second vibratable plate is characterized by the length L, and the height H; and
the first and second vibratable plates vibrate in a mode characterized by:
a first number N of nodal lines that are substantially aligned with the height of the first and second vibratable plates; and
a second number M of nodal lines that are substantially aligned with the length of the first and second vibratable plates; and
the quantity:

$$\frac{N \cdot H}{(2 \cdot M - 1) \cdot L}$$

is at least about three.

40. The electromechanical resonator according to claim 35 further comprising:
a recess in the semiconductor die that has a peripheral wall; wherein, the first vibratable plate, the second vibratable plate, and the first coupling member are located in the recess.

41. The electromechanical resonator according to claim 40 further comprising:
a first electrical crossover coupled between the peripheral wall and the first coupling member for coupling one or more electrical signals from the die major surface to the first coupling member.

42. The electromechanical resonator according to claim 41 further comprising:
a second coupling member that is coupled to the second side edge of the first vibratable plate and the second side edge of the second vibratable plate, for coupling the first and second vibratable plates and destructively combining acoustic energy emitted by the first and second vibrational plates; and
a second electrical crossover coupled between the peripheral wall and the second coupling member for coupling one or more electrical signals from the die major surface to the second coupling member.

43. The electromechanical resonator according to claim 42 wherein:
the first conductive pathway runs from the die major surface, over the first electrical crossover, over the first coupling member and onto the first vibratable plate; and
the second conductive pathway runs over the second electrical crossover, over the second coupling member and onto the second vibratable plate.

44. The electromechanical resonator according to claim 40 further comprising:
a third vibratable plate having:
a third vibratable plate major surface characterized by a third vibratable plate major surface normal that is substantially perpendicular to the die surface normal;
a first side edge;

a second side edge;
a bottom edge; and
a top edge; and
a fourth vibratable plate having:
a fourth vibratable plate major surface characterized by a fourth vibratable plate major surface normal that is substantially perpendicular to the die surface normal;
a first side edge;
a second side edge;
a bottom edge; and
a top edge; and
a second coupling member;
wherein,
the first side edge of the third vibratable plate and the first side edge of the fourth vibratable plate are coupled to the first coupling member;
the second side edge of the third vibratable plate and the second side edge of the fourth vibratable plate are coupled to the second coupling member;
the first, second, third and fourth vibratable plates are capable of vibrating at the first frequency;
a first distance between the first side edge of the first vibratable plate, and the first side edge of the third vibratable plate is about ½ the wavelength;
a second distance between the first side edge of the second vibratable plate, and the first side edge of the fourth vibratable plate is about ½ the wavelength;
whereby, acoustic energy emitted by the first, second, third, and fourth vibratable plates is destructively combined by the first and second coupling members.

45. The electromechanical resonator according to claim 44 further comprising:
a first electrical crossover for coupling signals from the die major surface to the first coupling member.

46. The electromechanical resonator according to claim 44 wherein the second conductive pathway includes:
a first branch that runs from the die major surface over the first electrical crossover to the first coupling member;
a second branch that runs from first electrical crossover over the first coupling member and onto the second vibratable plate; and
a third branch that runs from the first electrical crossover over the first coupling member and onto the third vibratable plate.

47. The electromechanical resonator according to claim 46 further comprising:
a second electrical crossover;
wherein the first conductive pathway includes:
a first branch that extends from the die major surface over the second electrical crossover, to the second coupling member;
a second branch that extends from the second electrical crossover, over the second coupling member and onto the first vibratable plate; and
a third branch that extends from the second electrical crossover over the second coupling member and onto the fourth vibratable plate.

48. The electromechanical resonator according to claim 46 further comprising:
a second electrical crossover over which the first conductive pathway runs;
a third electrical crossover that extends from the peripheral wall to the second coupling member;
a third conductive pathway that runs over the third electrical crossover, along the second coupling member, and onto the fourth vibratable plate;
a fourth electrical cross over that extends from the peripheral wall to the second coupling member; and
a fourth conductive pathway that includes:
a first branch that runs from the die major surface over the fourth electrical crossover to the second coupling member;
a second branch that runs from fourth electrical crossover over the second coupling member and onto the second vibratable plate; and
a third branch that runs from the fourth electrical crossover over the second coupling member and onto the third vibratable plate.

49. An electromechanical system comprising:
a semiconductor die including:
a first vibratable plate including:
a first vibratable plate electrode;
a second vibratable plate that is located proximate the first vibratable plate and includes:
a second vibratable plate electrode;
a first fixed electrode located on a first side of the first and second vibratable plates;
a second fixed electrode located on a second side of the first and second vibratable plates opposite the first side;
one or more biasing circuits for applying a first bias to the first vibratable plate electrode, applying a second bias to the second vibratable plate electrode, applying a third bias to the first fixed electrode, and applying a fourth bias to the second fixed electrode, wherein the first bias, second bias, third bias, and fourth bias are selected so that electrostatic forces on the first and second vibratable plates that are due to the first bias, second bias, third bias, and fourth bias are balanced.

50. The electromechanical system according to claim 49 wherein:
the first vibratable plate and the second vibratable plate are dimensioned to vibrate at a predetermined frequency that corresponds to a wavelength of acoustic waves in the die; and
the first and second vibratable plates are spaced apart by less than one-tenth of the wavelength.

51. A method of signal processing comprising the steps of:
biasing an electrode of a first vibratable plate to a first voltage;
applying a signal that includes a periodic signal component to an electrode of a second vibratable plate that is proximate to the first vibratable plate;
whereby, the signal establishes an attractive electric force between the first vibratable plate and the second vibratable plate that causes the first and second vibratable plates to vibrate in such a manner as to mirror each other, such that acoustic energy radiation from the first and second vibratable plates is cancelled by destructive interference.

52. The method according to claim 51 further comprising the step of:
biasing the electrode of the second vibratable plate to a second voltage.

53. The method according to claim 51 wherein:
the first vibratable plate comprises a first vibratable plate that is mechanically coupled to a die through a coupling member; and
the second vibratable plate comprises a second vibratable plate that is mechanically coupled to the die through the coupling member;

whereby, acoustic energy radiation from the first and second vibratable is cancelled by destructive interference in the coupling member.

54. A method of signal processing comprising the steps of:

biasing an electrode of a first vibratable plate to a first voltage;

biasing an electrode of a second vibratable plate to a second voltage;

biasing a fixed electrode that is located between the first vibratable plate and the second vibratable plate to a third voltage;

applying a signal that includes a periodic signal component to the fixed electrode;

whereby, the signal establishes a first attractive electric force between the first vibratable plate and the fixed electrode, and a second attractive force between the second vibratable plate and the fixed electrode, that cause the first and second vibratable plates to vibrate in such a manner as to mirror each other such that acoustic radiation from the first and second vibratable plates is cancelled by destructive interference.

55. The method according to claim 54 wherein:

the first voltage is substantially equal to the second voltage.

* * * * *